(12) United States Patent
Pakula et al.

(10) Patent No.: US 11,464,126 B2
(45) Date of Patent: *Oct. 4, 2022

(54) OFFSET CONTROL FOR ASSEMBLING AN ELECTRONIC DEVICE HOUSING

(71) Applicant: Apple Inc., Cupertino, CA (US)

(72) Inventors: David Pakula, San Francisco, CA (US); Richard Hung Minh Dinh, Saratoga, CA (US); Scott Myers, Saratoga, CA (US); Tang Yew Tan, Palo Alto, CA (US)

(73) Assignee: APPLE INC., Cupertino, CA (US)

( * ) Notice: Subject to any disclaimer, the term of this patent is extended or adjusted under 35 U.S.C. 154(b) by 13 days.

This patent is subject to a terminal disclaimer.

(21) Appl. No.: 17/033,117

(22) Filed: Sep. 25, 2020

(65) Prior Publication Data

US 2021/0014996 A1 Jan. 14, 2021

Related U.S. Application Data

(60) Continuation of application No. 16/439,103, filed on Jun. 12, 2019, now Pat. No. 10,842,036, which is a (Continued)

(51) Int. Cl.
*G06F 1/16* (2006.01)
*H05K 7/14* (2006.01)
(Continued)

(52) U.S. Cl.
CPC .................. *H05K 7/14* (2013.01); *G02B 7/02* (2013.01); *G06F 1/1626* (2013.01); *G06F 1/1637* (2013.01); *G06F 1/1656* (2013.01); *G06F 1/1658* (2013.01); *H04M 1/0202* (2013.01); *H05K 5/0086* (2013.01); *H05K 5/03* (2013.01);
(Continued)

(58) Field of Classification Search
CPC .... G06F 1/1626; G06F 1/1637; G06F 1/1656; G06F 1/1658
See application file for complete search history.

(56) References Cited

U.S. PATENT DOCUMENTS

| D118,749 S | 1/1940 | Zimmerman |
| D124,596 S | 1/1941 | Arenberg |

(Continued)

FOREIGN PATENT DOCUMENTS

| CN | 101379459 | 3/2009 |
| CN | 101722635 | 6/2010 |

(Continued)

OTHER PUBLICATIONS

Ixef Para technical data sheet, Solvay.com, downloaded Oct. 2014.
(Continued)

*Primary Examiner* — Adrian S Wilson
(74) *Attorney, Agent, or Firm* — Brownstein Hyatt Farber Schreck, LLP

(57) ABSTRACT

Housings for electronic devices are disclosed. According to one aspect, adjoining surfaces of electronic device housings can be mounted or arranged such that adjoining surfaces are flush to a high degree of precision. The electronic devices can be portable and in some cases handheld.

20 Claims, 25 Drawing Sheets

Related U.S. Application Data continuation of application No. 15/466,739, filed on Mar. 22, 2017, now Pat. No. 10,368,457, which is a continuation of application No. 13/967,636, filed on Aug. 15, 2013, now Pat. No. 9,606,579, which is a division of application No. 12/794,563, filed on Jun. 4, 2010, now Pat. No. 8,551,283.

(60) Provisional application No. 61/325,801, filed on Apr. 19, 2010, provisional application No. 61/300,780, filed on Feb. 2, 2010.

(51) Int. Cl.
| | | |
|---|---|---|
| *H04M 1/02* | (2006.01) | |
| *H05K 5/03* | (2006.01) | |
| *G02B 7/02* | (2021.01) | |
| *H05K 5/00* | (2006.01) | |
| *G02B 13/00* | (2006.01) | |
| *B29L 31/34* | (2006.01) | |
| *H04N 5/225* | (2006.01) | |

(52) U.S. Cl.
CPC ..... *B29L 2031/3481* (2013.01); *G02B 13/001* (2013.01); *H04M 1/0266* (2013.01); *H04N 5/2252* (2013.01); *Y10T 29/49002* (2015.01); *Y10T 156/10* (2015.01)

(56) References Cited

U.S. PATENT DOCUMENTS

| | | |
|---|---|---|
| 2,269,554 A | 1/1942 | Rolph |
| 4,403,224 A | 9/1983 | Wirnowski |
| 4,522,508 A | 6/1985 | Meister |
| 4,995,941 A | 2/1991 | Nelson et al. |
| 5,394,306 A | 2/1995 | Koenck et al. |
| 5,456,955 A | 10/1995 | Muggli |
| 5,514,319 A | 5/1996 | Young |
| 5,613,237 A | 3/1997 | Bent et al. |
| 5,681,515 A | 10/1997 | Pratt et al. |
| 5,867,149 A | 2/1999 | Jaeger |
| 5,896,575 A | 4/1999 | Higginbotham et al. |
| 5,899,012 A | 5/1999 | Crum et al. |
| 5,932,329 A | 8/1999 | Frost et al. |
| 6,058,293 A | 5/2000 | Phillips |
| 6,206,563 B1 | 3/2001 | Dombre et al. |
| 6,229,993 B1 | 5/2001 | Greenway et al. |
| 6,266,685 B1 | 7/2001 | Danielson et al. |
| 6,323,846 B1 | 11/2001 | Westerman et al. |
| 6,462,890 B2 | 10/2002 | Hsu |
| 6,510,226 B1 | 1/2003 | Thomann et al. |
| 6,532,152 B1 | 3/2003 | White et al. |
| 6,560,092 B2 | 5/2003 | Itou et al. |
| 6,678,001 B1 | 1/2004 | Elberbaum |
| 6,777,621 B2 | 8/2004 | Ishikawa et al. |
| 6,788,532 B2 | 9/2004 | Yang et al. |
| 6,796,708 B2 | 9/2004 | Kawamata et al. |
| 6,825,751 B1 | 11/2004 | Kita et al. |
| 6,842,288 B1 | 1/2005 | Liu et al. |
| 6,876,543 B2 | 4/2005 | Mockridge et al. |
| 6,914,773 B2 | 7/2005 | Yang et al. |
| 6,965,789 B2 | 11/2005 | Hauge et al. |
| 6,980,095 B2 | 12/2005 | Wright et al. |
| 7,031,148 B1 | 4/2006 | Lin |
| 7,046,230 B2 | 5/2006 | Zadesky et al. |
| 7,073,916 B2 | 7/2006 | Yin et al. |
| 7,113,237 B2 | 9/2006 | Nitto et al. |
| 7,123,243 B2 | 10/2006 | Kawasaki et al. |
| 7,236,588 B2 | 6/2007 | Gartrell |
| 7,330,356 B2 | 2/2008 | Park et al. |
| 7,388,616 B2 | 6/2008 | Yamazaki |
| 7,595,983 B2 | 9/2009 | Okuda |
| D606,539 S | 12/2009 | Liao et al. |
| 7,636,244 B2 | 12/2009 | Kriege et al. |
| 7,697,269 B2 | 4/2010 | Yang et al. |
| 7,697,281 B2 | 4/2010 | Dabov et al. |
| 7,711,256 B2 | 5/2010 | Wun |
| 7,796,381 B2 | 9/2010 | Zuo et al. |
| 7,872,661 B2 | 1/2011 | Lim et al. |
| 7,872,861 B2 | 1/2011 | Ou et al. |
| 7,933,123 B2 | 4/2011 | Wang et al. |
| 8,004,835 B2 | 8/2011 | Conti et al. |
| 8,023,261 B2 | 9/2011 | Sanford |
| 8,238,087 B2 | 8/2012 | McClure et al. |
| 8,254,098 B2 | 8/2012 | Liu et al. |
| 8,320,978 B2 | 11/2012 | Chang et al. |
| 8,551,283 B2* | 10/2013 | Pakula .................... G02B 7/02 |
| | | 156/312 |
| 8,607,444 B2 | 12/2013 | Jarvis et al. |
| 8,770,815 B2* | 7/2014 | Hardacker ............... H04N 5/64 |
| | | 362/605 |
| 8,797,721 B2 | 8/2014 | Pakula et al. |
| 8,824,140 B2* | 9/2014 | Prest .................... H05K 5/0086 |
| | | 361/679.56 |
| 9,185,816 B2 | 11/2015 | Pakula et al. |
| 9,232,670 B2 | 1/2016 | Pakula et al. |
| 9,235,240 B2 | 1/2016 | Pakula et al. |
| 9,357,665 B2 | 5/2016 | Myers et al. |
| 9,606,579 B2* | 3/2017 | Pakula ................. G06F 1/1637 |
| 9,846,452 B2 | 12/2017 | Pakula et al. |
| 10,368,457 B2* | 7/2019 | Pakula ................ H04M 1/0202 |
| 10,842,036 B2* | 11/2020 | Pakula .................... H05K 5/03 |
| 2002/0054151 A1 | 5/2002 | Inomata |
| 2002/0172017 A1 | 11/2002 | Tarnowski |
| 2003/0006128 A1 | 1/2003 | Giles et al. |
| 2003/0045246 A1 | 3/2003 | Lee et al. |
| 2003/0108720 A1 | 6/2003 | Kashino |
| 2003/0164905 A1 | 9/2003 | Yamaoka et al. |
| 2003/0184894 A1 | 10/2003 | Bischof et al. |
| 2003/0234768 A1 | 12/2003 | Rekimoto |
| 2004/0022017 A1 | 2/2004 | Chuang |
| 2004/0042168 A1 | 3/2004 | Yang et al. |
| 2004/0079457 A1 | 4/2004 | Kimura et al. |
| 2004/0189889 A1 | 9/2004 | Nitto et al. |
| 2004/0212555 A1 | 10/2004 | Falco |
| 2005/0030707 A1 | 2/2005 | Richardson |
| 2005/0052425 A1 | 3/2005 | Zadesky et al. |
| 2005/0062902 A1 | 3/2005 | Fukayama |
| 2005/0083308 A1 | 4/2005 | Homer et al. |
| 2005/0130721 A1* | 6/2005 | Gartrell ............... H04M 1/0283 |
| | | 455/575.8 |
| 2005/0135724 A1* | 6/2005 | Helvajian ............... C03C 15/00 |
| | | 385/14 |
| 2005/0285991 A1 | 12/2005 | Yamazaki |
| 2005/0286214 A1 | 12/2005 | Chen |
| 2006/0055839 A1 | 3/2006 | Hirao et al. |
| 2006/0132644 A1 | 6/2006 | Shangguan et al. |
| 2006/0158839 A1 | 7/2006 | Deluga |
| 2006/0197750 A1 | 9/2006 | Kerr et al. |
| 2006/0239746 A1 | 10/2006 | Grant |
| 2006/0268528 A1* | 11/2006 | Zadesky ............. H04M 1/0202 |
| | | 361/728 |
| 2006/0292439 A1 | 12/2006 | Zuo et al. |
| 2007/0025072 A1 | 2/2007 | Liao |
| 2007/0052679 A1 | 3/2007 | Liang |
| 2007/0173299 A1 | 7/2007 | Sawayama et al. |
| 2007/0189120 A1 | 8/2007 | Yang et al. |
| 2007/0257398 A1 | 11/2007 | Veenstra et al. |
| 2008/0062660 A1 | 3/2008 | Weber et al. |
| 2008/0092809 A1 | 4/2008 | Lin et al. |
| 2008/0131683 A1 | 6/2008 | Ristic-Lehmann et al. |
| 2008/0146293 A1 | 6/2008 | Kim et al. |
| 2008/0165067 A1 | 7/2008 | Kim |
| 2008/0165485 A1 | 7/2008 | Zadesky et al. |
| 2008/0166009 A1 | 7/2008 | Dinh et al. |
| 2008/0182633 A1 | 7/2008 | Imaizumi et al. |
| 2008/0206492 A1 | 8/2008 | Husemann et al. |
| 2008/0239647 A1 | 10/2008 | Luo et al. |
| 2008/0264548 A1 | 10/2008 | Zhang |
| 2008/0266766 A1 | 10/2008 | D'Urso et al. |
| 2008/0316117 A1 | 12/2008 | Hill et al. |
| 2008/0316121 A1 | 12/2008 | Hobson et al. |
| 2009/0002930 A1 | 1/2009 | Nakanishi et al. |

(56) References Cited

U.S. PATENT DOCUMENTS

| | | |
|---|---|---|
| 2009/0003141 A1 | 1/2009 | Ozawa |
| 2009/0017263 A1* | 1/2009 | Yeates .................... B22D 19/04 |
| | | 428/167 |
| 2009/0046072 A1 | 2/2009 | Emig et al. |
| 2009/0046240 A1 | 2/2009 | Bolton |
| 2009/0049773 A1 | 2/2009 | Zadesky et al. |
| 2009/0054115 A1 | 2/2009 | Horrdin et al. |
| 2009/0059485 A1 | 3/2009 | Lynch et al. |
| 2009/0059502 A1 | 3/2009 | Filson et al. |
| 2009/0065136 A1 | 3/2009 | Nadella et al. |
| 2009/0067141 A1 | 3/2009 | Dabov et al. |
| 2009/0093575 A1 | 9/2009 | Kabashima et al. |
| 2009/0245564 A1 | 10/2009 | Mittleman et al. |
| 2009/0257189 A1 | 10/2009 | Wang et al. |
| 2009/0257207 A1 | 10/2009 | Wang et al. |
| 2009/0264160 A1 | 10/2009 | Mochizuki et al. |
| 2009/0291709 A1 | 11/2009 | Lee et al. |
| 2009/0296325 A1* | 12/2009 | Morimoto ............ H04M 1/185 |
| | | 361/679.01 |
| 2010/0014232 A1* | 1/2010 | Nishimura ........ B29C 45/14073 |
| | | 361/679.3 |
| 2010/0060563 A1 | 3/2010 | Hayton et al. |
| 2010/0061040 A1 | 3/2010 | Dabov et al. |
| 2010/0061044 A1 | 3/2010 | Zou et al. |
| 2010/0089729 A1 | 4/2010 | Li et al. |
| 2010/0091442 A1 | 4/2010 | Theobald et al. |
| 2010/0120480 A1 | 5/2010 | Jung |
| 2010/0149410 A1 | 6/2010 | Matsuzawa |
| 2010/0190530 A1 | 7/2010 | Wade et al. |
| 2010/0203924 A1 | 8/2010 | Hirota |
| 2010/0269891 A1 | 10/2010 | Kinard et al. |
| 2010/0277439 A1* | 11/2010 | Charlier ................ G06F 1/1616 |
| | | 345/176 |
| 2010/0283394 A1 | 11/2010 | Ong |
| 2010/0309369 A1 | 12/2010 | Jarvis et al. |
| 2010/0315570 A1 | 12/2010 | Mathew et al. |
| 2011/0019123 A1 | 1/2011 | Prest et al. |
| 2011/0050053 A1* | 3/2011 | Deng .................. H04M 1/0266 |
| | | 312/223.1 |
| 2011/0050054 A1* | 3/2011 | Chang ................ H04M 1/0266 |
| | | 312/223.1 |
| 2011/0086676 A1 | 4/2011 | Choi et al. |
| 2011/0096483 A1 | 4/2011 | Wang et al. |
| 2011/0136553 A1 | 6/2011 | Jo |
| 2011/0164365 A1 | 7/2011 | McClure et al. |
| 2011/0164372 A1* | 7/2011 | McClure ............ G06F 1/1656 |
| | | 361/679.26 |
| 2011/0165361 A1 | 7/2011 | Sherman et al. |
| 2011/0186345 A1 | 8/2011 | Pakula et al. |
| 2011/0187245 A1 | 8/2011 | Pakula et al. |
| 2011/0188180 A1 | 8/2011 | Pakula et al. |
| 2011/0215685 A1 | 9/2011 | Jarvis et al. |
| 2011/0255000 A1* | 10/2011 | Weber .................... G03B 17/02 |
| | | 348/374 |
| 2011/0255218 A1 | 10/2011 | Pakula et al. |
| 2011/0255227 A1 | 10/2011 | Murakami |
| 2012/0113611 A1 | 5/2012 | Maniar et al. |
| 2012/0118628 A1 | 5/2012 | Pakula et al. |
| 2012/0275088 A1 | 11/2012 | Huang |
| 2013/0063876 A1 | 3/2013 | Pakula et al. |
| 2013/0335357 A1 | 12/2013 | Hou et al. |
| 2014/0307370 A1 | 10/2014 | Zadesky et al. |

FOREIGN PATENT DOCUMENTS

| | | |
|---|---|---|
| CN | 101518168 | 12/2011 |
| CN | 101458408 | 1/2012 |
| EP | 0458016 | 11/1991 |
| EP | 1879363 | 1/2008 |
| EP | 2026408 | 2/2009 |
| JP | 06/94848 | 4/2004 |
| JP | A 2006/276623 | 10/2006 |
| JP | A 2008/518807 | 6/2008 |
| JP | A 2009/259908 | 11/2009 |
| JP | A 2010/091742 | 4/2010 |
| WO | WO 2008/035736 | 3/2008 |
| WO | WO 2009/024842 | 2/2009 |
| WO | WO 2009/126480 | 10/2009 |
| WO | WO 2010/033571 | 3/2010 |
| WO | WO 2010/101961 | 9/2010 |
| WO | WO 2010/074144 | 12/2011 |

OTHER PUBLICATIONS

Henkel, "Loctite Liquid Optically Clear Adhesives," Henkeina.com, pp. 1-2, Mar. 18, 2013.

Lu, "Liquid Optically Clear Adhesives for Display Applications," Henkeina.com, pp. 1-4, Apr. 1, 2001.

Solvay Specialty Polymers USA, LLC, "Ixef Polyarylamide (PARA)," Version 2.2, Apr. 2012.

International Search Report and Written Opinion, PCT/US2010/049876, dated Jun. 7, 2011.

International Search Report and Written Opinion, PCT/US2011/058999, dated Feb. 15, 2012.

International Preliminary Report, PCT/US2011/058999, dated May 23, 2013.

* cited by examiner

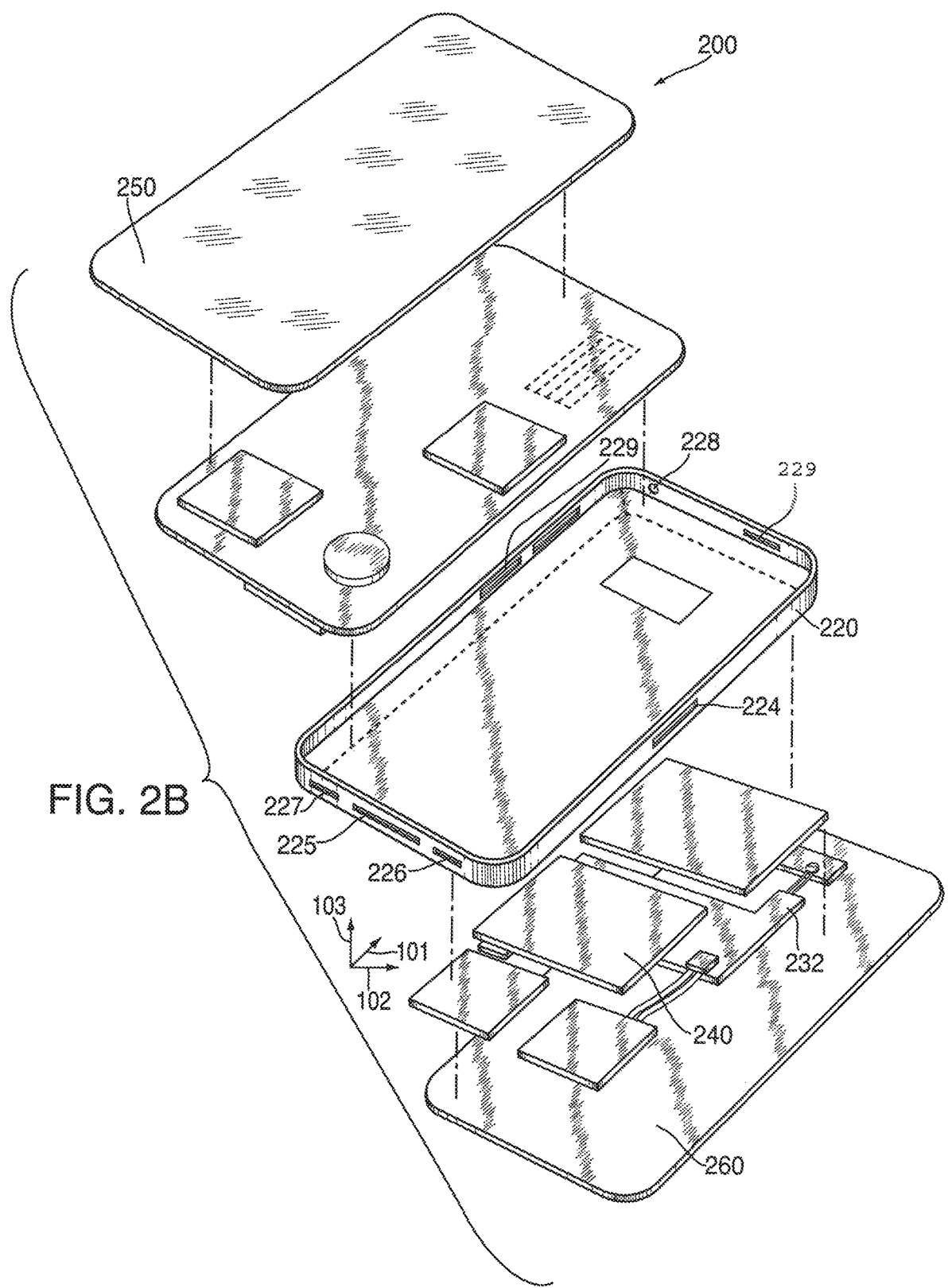

OFFSET CONTROL FOR ASSEMBLING AN ELECTRONIC DEVICE HOUSING

CROSS-REFERENCE TO RELATED APPLICATION(S)

This application is a continuation patent application of U.S. patent application Ser. No. 16/439,103, filed Jun. 12, 2019 and titled "Offset Control for Assembling an Electronic Device Housing," which is a continuation patent application of U.S. patent application Ser. No. 15/466,739, filed Mar. 22, 2017 and titled "Offset Control for Assembling an Electronic Device Housing," now U.S. Pat. No. 10,368,457, which is a continuation patent application of U.S. patent application Ser. No. 13/967,636, filed Aug. 15, 2013 and titled "Offset Control for Assembling an Electronic Device Housing," now U.S. Pat. No. 9,606,579, which is a divisional patent application of U.S. patent application Ser. No. 12/794,563, filed Jun. 4, 2010 and titled "Offset Control for Assembling an Electronic Device Housing," now U.S. Pat. No. 8,551,283, which is a nonprovisional patent application of and claims the benefit of U.S. Provisional Patent Application No. 61/325,801, filed Apr. 19, 2010 and titled "Housings for Electronic Devices and Methods Therefor," and is a nonprovisional patent application of and claims the benefit of U.S. Provisional Patent Application No. 61/300,780, filed Feb. 2, 2010 and titled "Handheld Device Enclosure," the disclosures of which are hereby incorporated herein by reference in their entireties.

BACKGROUND

Portable electronic devices can be constructed using a variety of different approaches. For example, a "bucket" type approach can be used in which a first housing component serves as a bucket into which electronic device components are placed, and a second housing component serves as a cover for the bucket. This arrangement secures the electronic device components between the first and second housing components. As a variation of this, some or all of the electronic device components can be assembled into the cover for the bucket, and the cover can subsequently be rotated into the bucket to close the device.

Other known portable electronic devices can be constructed by inserting components into a hollow housing element. For example, an electronic device can be constructed using a tubular structure (e.g., a flattened tube or a hollow rectangular tube) into which electronic device components can be inserted. The electronic device components can be inserted into the tubular structure from one or both ends, and connected within the structure. For example, one or more circuits inserted from opposite ends of the tubular structure can be connected through an opening for a window in the structure. The structure can be capped at one or both ends to ensure that the components remain fixed within the tubular structure, and to provide interface components (e.g., connectors, buttons, or ports) for the device.

Unfortunately, however, as portable electronic device continue to be made smaller, thinner and/or more powerful, there remains a continuing need to provide improved techniques and structures for providing housings for portable electronic devices.

SUMMARY

Embodiments are described herein in the context of housings for electronic devices. According to one aspect, adjoining surfaces of electronic device housings can be mounted or arranged such that adjoining surfaces are flush to a high degree of precision. The electronic devices can be portable and in some cases handheld.

The invention pertains to apparatus, systems and methods for assembling electronic devices, namely, portable or handheld electronic devices.

The invention may be implemented in numerous ways, including, but not limited to, as a method, system, device, or apparatus. Several embodiments of the invention are discussed below.

As a method for assembling a device housing of an electronic device, one embodiment can, for example, provide an outer glass member for the device housing, and provide a protective side structural member having a receptive plane that is to receive the outer glass member. A liquid adhesive can be applied to a portion of the outer glass member and/or a portion of the protective side structural member. The outer glass member can be positioned adjacent to the receptive plane of the protective side structural member. A first a first force can be applied to push the outer glass member against a planar reference surface, and a second force can be applied to push the protective side structural member against the planar reference surface. The second force is independently applied from the first force. Still further, the liquid adhesive can be cured into a solid bonding material that bonds together the outer glass member and the protective side structural member, thereby assembling the outer glass member with the protective side structural member. Subsequently, the first force and the second force can be removed.

As a method for assembling a device housing of an electronic device, one embodiment can, for example, provide an outer housing member for the device housing, and provide a protective side structural member. A first force can then be applied to push the outer housing member against a planar reference surface, and a second force can be applied to push the protective side structural member against the planar reference surface. The second force is independently applied from the first force. The outer housing member and the protective side structural member can then be secured together, thereby assembling a portion of the device housing including at least the outer housing member with the protective side structural member. The assembled portion of the device housing can then be removed from the planar reference surface.

As an electronic device enclosure, one embodiment can, for example, include at least an outer periphery member defining a side surface for the electronic device enclosure, and an internal structure secured to an inner surface of the outer periphery member. The internal structure can be offset from front and back planar boundaries of the outer periphery member. The electronic device enclosure can further include a front cover assembly placed and secured adjacent the front planar boundary of the outer peripheral boundary, thereby providing a front surface for the electronic device enclosure. The front cover assembly can include a front cover member and a protective side member, the protective side member being provided against and around the sides of the front cover member.

According to one aspect of the present invention, an apparatus includes a cover part that includes at least one attachment protruding therefrom. The apparatus also includes a housing part and at least one electronic component. The housing part includes at least one receptacle configured to receive the attachment. The receptacle is defined at least partially on a first side and is configured to capture the attachment. The cover part is interfaced with a second side of the housing part when the attachment is captured in the receptacle. Finally, the electronic component is arranged within an inner volume defined by at least the housing part. In one embodiment, the cover part is in substantially direct contact with the second side of the housing part when the attachment is captured in the receptacle.

Other aspects and advantages of the invention will become apparent from the following detailed description taken in conjunction with the accompanying drawings which illustrate, by way of example, the principles of the invention.

BRIEF DESCRIPTION OF THE DRAWINGS

The accompanying drawings, which are incorporated into and constitute a part of this specification, illustrate one or more example embodiments and, together with the description of example embodiments, serve to explain the principles and implementations associated with the specification.

FIGS. 2A-2C are views of an electronic device structure in accordance with another embodiment.

DETAILED DESCRIPTION

Figure 1A:
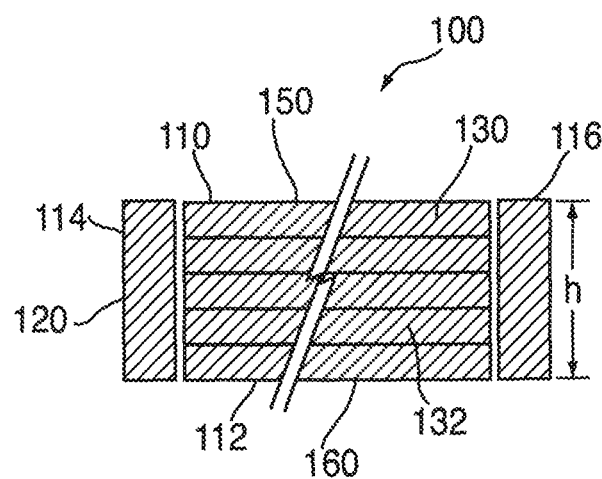
FIGS. 1A-1D are views of an electronic device structure in accordance with one embodiment.

Embodiments are described herein in the context of a housing for an electronic device. The housing can make use of an outer member. The outer member can be aligned, protected and/or secured with respect to other portions of the housing for the electronic device. The electronic device can be portable and in some cases handheld.

According to one aspect, adjoining surfaces of electronic device housings can be mounted or arranged such that adjoining surfaces are flush to a high degree of precision. Edges of portable electronic devices are susceptible to impact force, such as when dropped. According to another aspect, protective sides can be provided on edges of electronic device housings so to dissipate impact forces and thus reduce damage to electronic device housings. According to still another embodiment, an electronic device housing can have one or more of its exposed major surfaces (e.g., front or back surfaces) formed of glass. The glass surfaces can be protected by the protective sides and/or can be aligned so that the top surfaces of the glass surfaces and the protective sides can be substantially flush.

According to another aspect, apparatus, systems and methods for robustly attaching a cover portion of an electronic device to a bottom portion, e.g., a housing portion, of the electronic device are described. The cover portion may generally include a frame (e.g., interface member) into which n outer member (e.g., glass member) has been inserted. Attachment members (e.g., arms, tabs) can be coupled to, e.g., insert molded into, a cover portion, and can be arranged to substantially engage with a housing portion such that the cover portion is effectively held against the housing portion. The attachment members can be used to fasten the cover portion to the housing. In general, receptacles of the housing portion are arranged to substantially capture, mate or otherwise engage attachment members of the cover portion.

According to another aspect, a cover assembly can be configured to support and protect an outer glass member. The cover assembly can form part of a housing for an electronic device. The cover assembly can also include a distinct glass lens, attachment members, structural support.

According to still another aspect, an optical lens can be formed from a formed optical adhesive. The optical lens can, for example, be used as a lens for a camera flash of a portable electronic device. The optical lens can be provided between the camera flash and the cover member A mold can be used to form a lens from the optical adhesive.

The following detailed description is illustrative only, and is not intended to be in any way limiting. Other embodiments will readily suggest themselves to skilled persons having the benefit of this disclosure. Reference will now be made in detail to implementations as illustrated in the accompanying drawings. The same reference indicators will generally be used throughout the drawings and the following detailed description to refer to the same or like parts. It should be appreciated that the drawings are generally not drawn to scale, and at least some features of the drawings have been exaggerated for ease of illustration.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

According to one aspect, a housing for an electronic device can include an outer periphery member that forms the sides of the electronic device. The outer periphery member can define a volume into which electronic device components can be placed. To obtain the components within the device, front and back covers can be placed over the front and back surfaces of the outer periphery member.

An outer periphery member can provide a variety of attributes to the electronic device including for example, structural, functional, cosmetic, or combinations of these. The outer periphery member may for example form at least a portion of the right, left, top and bottom sides of the device. As such, the outer periphery member may surround components that are placed in the device back to front, front to back or center to back and front (e.g., components inserted within the volume defined by the outer periphery member). The outer periphery member may be formed from one or more elements. The elements may be similar or different depending on the dimensions or shape of the device, as well as functional or structural considerations (e.g., outer periphery member elements serving as an antenna for tuning electromagnetic waves). If several elements are combined to form the outer periphery members, the elements can be connected in any suitable manner to form a single unit having adequate structural, functional, or cosmetic properties. In some cases, the outer periphery member can be formed from several elements that act as a single integral unit (e.g., a unitary part). For example, the elements can be integrally formed together.

In some embodiments, the outer periphery member can define a band that forms an enclosed volume having a front and back open area. The band may define a ring-like structure that wraps around some or all of the components of the electronic device. The electronic device can include a variety of components such as housing elements, electronics, structural members, or combinations of these. In some cases, one or more structural members (e.g., a mid-plate) can be connected to the outer periphery member within the volume enclosed by the outer periphery member to receive and support components, or enhance the structural properties of the outer periphery member.

In some embodiments, the electronic device can include front and/or back cover assemblies operative to cap the volume defined by the outer periphery member. The cover assemblies can be positioned relative to the open areas of the outer periphery member such that the front and back cover assemblies are placed adjacent to the front and back surfaces of the outer periphery member, respectively. The cover assemblies can include any suitable feature, including for example housing portions, access points, electronics, structural members, aesthetic members, or combinations of these. In some cases, the cover assemblies can include one or more features for securing or retaining electronic device components within the volume enclosed by the outer periphery member.

The outer periphery member and the front and back cover assemblies can provide some or all of the exterior surfaces of the device, and thus define the outer periphery form or look and feel of the electronic device. In particular, the front cover can substantially form the front surface of the device, the back cover can substantially form the back surface of the device, and the outer periphery member can substantially form the top, bottom, left and right surfaces of the device. It will be understood, however, that some or all of the cover assemblies can instead or in addition provide part of the top, bottom, left or right surfaces of the device, and that some or all of the outer periphery member can provide part of the front or back surfaces of the device.

Because the cover assemblies can define exposed surfaces of the electronic device, one or both of the cover assemblies can include components, coatings or finishes that enhance the functional, cosmetic and/or aesthetic characteristics of the assemblies. For example, one or both of the cover assemblies can include a transparent or translucent window through which input/output components are able to be used by the user. For example, one output component that can be used is a display device that can present information to the user via the cover assembly. As another example, one input component that can be used is a touch sensor (e.g., touch sensor) that can receive user input from the user via the cover assembly. As another example, one or both of the cover assemblies can include a cosmetic component for enhancing the aesthetic appeal of the device. In some embodiments, the cosmetic component can cause the cover assembly to be substantially opaque in some areas (e.g., on a back cover assembly), yet transparent or translucent in other areas (e.g., on a front cover assembly through which content generated by the display device is provided). In other words, the cover assembly can include a transparent or translucent window that is provided on a portion of the cover assembly. The cover assemblies can also support other function features, such as a camera opening, a lens, a light, a sensor, etc.

Internal components of the electronic device can be assembled using any suitable approach. In some embodiments, the internal components can define one or more layers that are placed within the outer periphery member. For example, layers can initially be placed near the center of the volume defined by the outer periphery member, and subsequently be added towards one or both of the front and back surfaces of the device. Each layer added to the device can be coupled or fit to a layer previously inserted and attached to the device.

To further retain component layers, the electronic device can include an internal platform providing a structural element for the outer periphery member and to which component layers can be coupled. In some embodiments, the internal platform can provide attachment points for the various layers placed within the electronic device. The internal platform may be placed within the height of the outer periphery member such that it is substantially near the middle of the outer periphery member (e.g., at half the height of the outer periphery member), thus defining a mid-plate. In particular, the mid-plate can form a substantially H-shape cross-section with the outer periphery member, thus providing enhanced structural properties. Electronic device components or layers can be assembled to both the front and back surfaces of the mid-plate (e.g., the mid-plate separates the internal volume of the outer periphery member into two distinct regions or pockets). The mid-plate can be secured to the outer periphery member (e.g., using welding, or formed with or made integral with the outer periphery member. Although called a plate or platform it will be understood that the internal platform can take a variety of non-planar forms, including various formations that include steps, offsets, curved surfaces, or combinations of these.

Figure 1B:
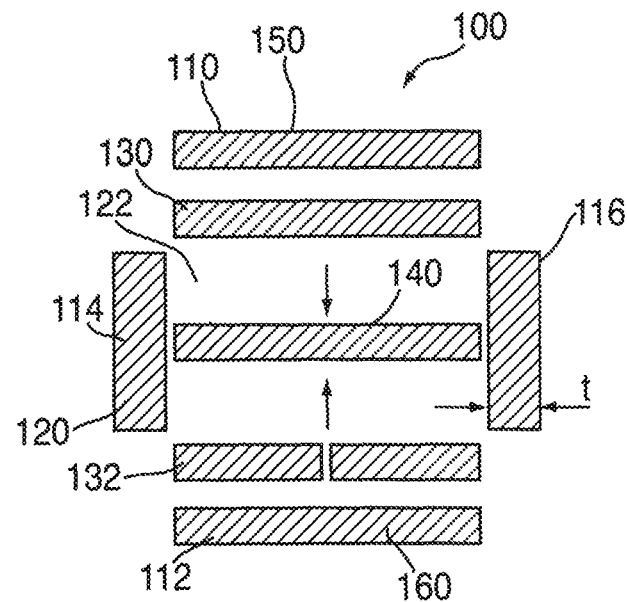
Figure 1C:
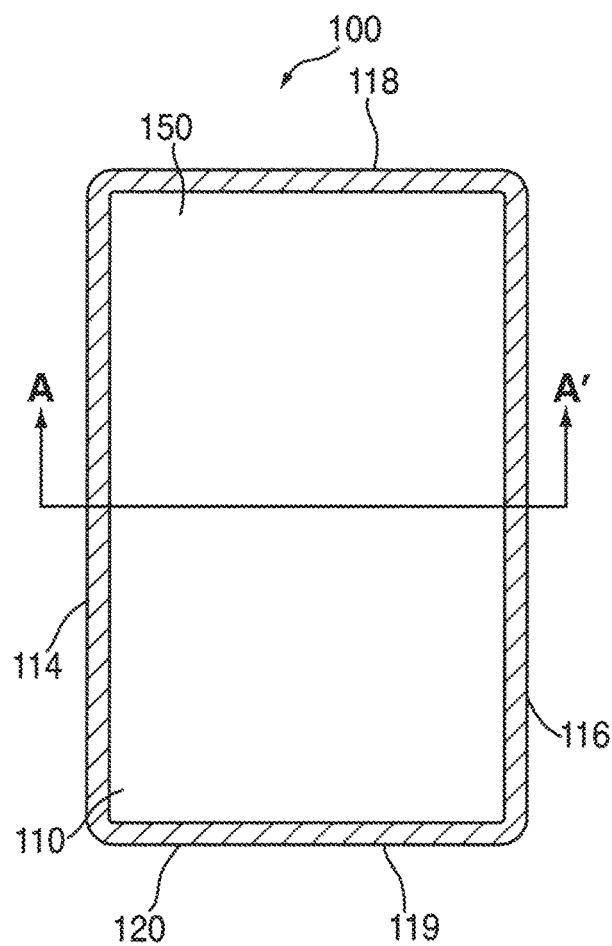
Figure 1D:
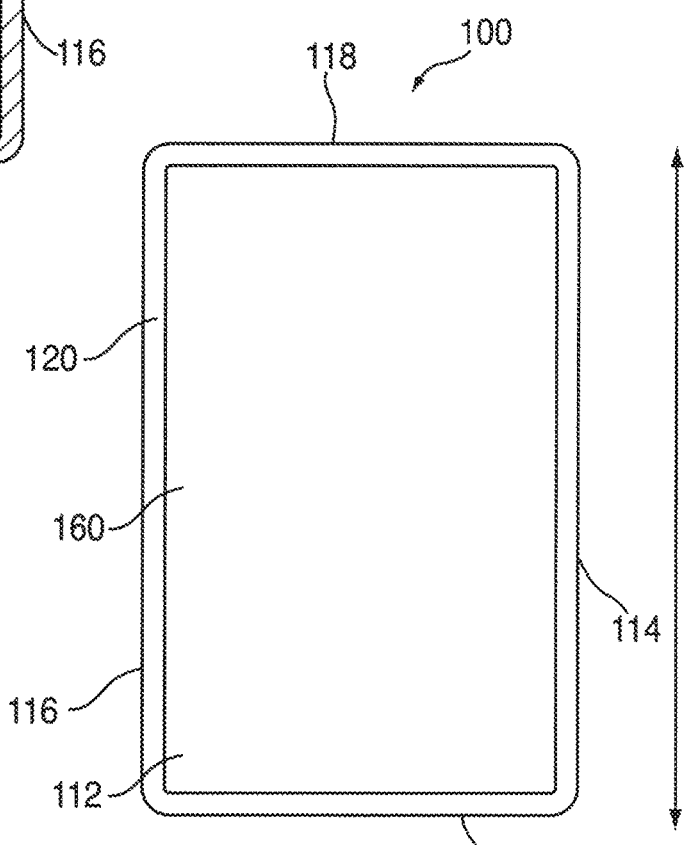

FIG. 1A is a cross-sectional view of an illustrative electronic device structure taken along the device width in accordance with one embodiment. FIG. 1B is an exploded cross-sectional view of an illustrative electronic device taken along the device length in accordance with one embodiment. FIG. 1C is a top view of an illustrative electronic device in accordance with one embodiment. FIG. 1D is a bottom view of an illustrative electronic device in accordance with one embodiment. Electronic device 100 can include any suitable type of electronic device having a display, including for example a media player, a mobile telephone, a personal e-mail or messaging device, pocket-sized personal computers, personal digital assistants (PDAs), a laptop computer, a desktop computer, a music recorder, a video recorder, a camera, radios, medical equipment, and devices combining some or all of this functionality.

Electronic device 100 can have any suitable shape, including for example a shape delimited by front surface 110, back surface 112, left surface 114, right surface 116, top surface 118 and bottom surface 119 (not shown in the cross-section). Each surface can be substantially planar, curved, or combinations of these. The surfaces can include one or more chamfers, detents, openings, dips, extensions, or other features modifying the smoothness of the surfaces.

Electronic device 100 can be constructed using any suitable structure, including for example using outer periphery member 120. Outer periphery member 120 can surround or wrap some or all of the electronic device such that the outer periphery member defines an internal volume 122 into which electronic device components can be placed. For example, outer periphery member 120 can wrap around the device such that the external surfaces of outer periphery member 120 define left surface 114, right surface 116, as well as top surface 118 and bottom surface 119 of the device. To provide a desired functionality to a user, the electronic device can include several components placed within the device, for example within volume 122.

The outer periphery member can have a particular height (e.g., the device height h) such that the outer periphery member encloses volume 122 into which electronic device components can be assembled. The thickness (e.g., outer periphery member thickness t), length (e.g., device length l), height (e.g., device height h), and cross-section of the outer periphery member can be selected based on any suitable criteria including for example based on structural requirements (e.g., stiffness, or resistance to bending, compression, tension or torsion in particular orientations). In some embodiments, the outer periphery member can serve as a structural member to which other electronic device components can be mounted. The outer periphery member can include one or more depressions, recesses, channels, protrusions, or openings for supporting components or for providing structural support for the device. In some embodiments, an opening can be used to provide access to one or more internal components contained within the outer peripheral member.

Outer periphery member 120 (or device 100) can have any suitable cross-section. For example, outer periphery member 120 can have a substantially rectangular cross-section. In some embodiments, outer periphery member 120 can instead or in addition have a cross-section in a different shape, including for example a circular, oval, polygonal, or curved cross-section. In some embodiments, the shape or size of the cross-section can vary along the length or width of the device (e.g., an hourglass shaped cross-section).

Electronic device components can be placed within volume 122 using any suitable approach. For example, electronic device 100 can include components 130 and 132 can be inserted into volume 122. Each of components 130 and 132 can include individual components, or several components assembled together as a component layer or stack, or include several distinct layers of components to insert within volume 122. In some embodiments, components 130 and 132 can each represent several components stacked along the height of the device. The component layers can be electrically coupled to each other to enable data and power transfers, as required for the proper operation of electronic device 100. For example, the component layers can be electrically coupled using one or more of a PCB, flex, solder, SMT, wires, connectors, or combinations of these. The component layers can be inserted into outer periphery member 120 using any suitable approach. For example, components 130 and 132 can all be inserted from front surface 110 or from back surface 112 (e.g., back to front, front to back, or middle to front and back). Alternatively, the components can be inserted from both front surface 110 and back surface 112.

In some embodiments, one or more of the components can serve as a structural element. Alternatively, electronic device 100 can include a distinct structural element placed within volume 122 and coupled to outer periphery member 120. For example, electronic device 100 can include one or more internal member or platform 140, which can serve as a mounting points or regions for helping secure, hold or pack one or more component layers (e.g., attaching component 130 to the back surface of internal platform 140, and component 132 to the front surface of internal platform 140). Internal platform 140 can be coupled to outer periphery member 120 using any suitable approach, including for example using snaps, fasteners, flexures, welds, glue, or combinations of these. Alternatively, internal platform 140 may even be part of the outer periphery member (e.g., machined, extruded, or cast, or integrally formed as a single unit). The internal platform can have any suitable size, including for example a size that is smaller than the internal volume of outer periphery member 120.

Internal platform 140 can be positioned at any suitable height within outer periphery member 120, including for example substantially at half the height of outer periphery member 120. The resulting structure (e.g., outer periphery member 120 and internal platform 140) can form an H-shaped structure that provides sufficient stiffness and resistance to tension, compression, torsion and bending.

The internal platform, inner surfaces of the outer periphery members, or both can include one or more protrusions, depressions, shelves, recesses, channels, or other features for receiving or retaining electronic device components. In some cases, the internal platform, outer periphery member or both can include one or more openings for coupling components located in the front and back regions. The size of each region can be selected based on any suitable criteria, including for example operational needs of system, numbers and types of electrical components in the device, manufacturing constraints of the internal platform, or combinations of these. The internal platform can be constructed as a distinct component constructed from any suitable material (e.g., plastic, metal or both), or instead defined from an existing electronic device component placed within the volume defined by the outer periphery member. For example, the internal platform can be formed by a printed circuit board or chip used by the device.

In some embodiments internal platform 140 and/or opening 122 can include one or more electrically conductive elements for providing electrical connections between the components. For example, internal platform 140 and/or opening 122 can include one or more PCB, flex, wire, solder pad, cable, connector, or other electrically conductive mechanism for connecting components within the electronic device.

Electronic device 100 can include front cover assembly 150 and back cover assembly 160 defining the front and back surfaces, respectively, of electronic device 100. The front and back cover assemblies can include one or more components, or can include at least a front member and a back member that form some or all of the outer front and back surfaces of the device. Front and back cover assemblies 150 and 160 can be flush, recessed or protruding relative to the front and back surfaces of outer periphery member 120. In some embodiments, one or both of front and back cover assemblies 150 and 160 can include delicate or fragile components. To protect the components from damage during use or when dropped, one or both of the cover assemblies can be flush or sub-flush relative to the outer periphery member to prevent edges from engaging other surfaces. Alternatively, the one or more of the cover assemblies can be "proud" (i.e., protrude above the edge of the outer peripheral member). In some embodiments, one or both of front cover assembly 150 and back cover assembly 160 can include one or more display regions through which one or more display devices can be viewed. The one or more display regions can be defined by boarders provided by coating or finish can be applied the front member or the back member. Similarly, the coating or finish can also be applied to the front member or the back member can also provide a masking effect to hide internal components.

In some embodiments, the electronic device can be substantially made of glass. For example, portions of the electronic device housing can have at least 75% of its exterior as glass. In one implementation, one or both of the cover assemblies can be glass while side surface are some material other than glass (e.g., metal, plastic).

In some embodiments, the housing a portable electronic device can be banged or rub against various surfaces. When plastic or metal housing surfaces are used, the surfaces can tend to become scratched. On the other hand, glass housing surfaces (e.g., glass cover assemblies) can be more scratch resistant. Moreover, glass housing surfaces can offer radio transparency, while metal housing surfaces can disturb or hinder radio communications. In one embodiment, an electronic device housing can use glass housing members (e.g., glass cover assemblies) for a front surface and a back surface of the electronic device housing. For example, a front surface formed from a glass housing member can be transparent to provide visual access to a display device positioned behind the glass housing member at the front surface, while a back surface formed from a glass housing member can be transparent or non-transparent. Non-transparency, if desired, can conceal any interior components within the electronic device housing. In one embodiment, a surface coating or film can be applied to the glass housing member to provide non-transparency or at least partial translucency. Such a surface coating or film can be provided on an inner surface or an outer surface of the glass housing member.

In some embodiments, one or both of front and back cover assemblies 150 and 160 can provide side protection for the front and back members. When the front member is formed of glass, the side protection can serve to protect the front member from damage if subjected to impact forces. When the back member is formed of glass, the side protection can serve to protect the back member from damage if subjected to impact forces.

In some embodiments, one or both of front and back cover assemblies 150 and 160 can provide attachment members that can serve to attach front and back cover assemblies 150 and 160. For example, front cover assembly 150 can include attachment members to attach front cover assembly 150 to internal platform 140 and/or outer periphery member 120. Back cover assembly 160 can include attachment members to attach back cover assembly 160 to internal platform 140 and/or outer periphery member 120.

In some embodiments, one or both the front and back members of front and back cover assemblies 150 and 160 can be formed of glass. The front or back member formed primarily of glass can include one or more pieces of glass. For example, the different pieces of glass can have different configurations, optical properties, and/or cosmetic appearance.

Figure 2A:
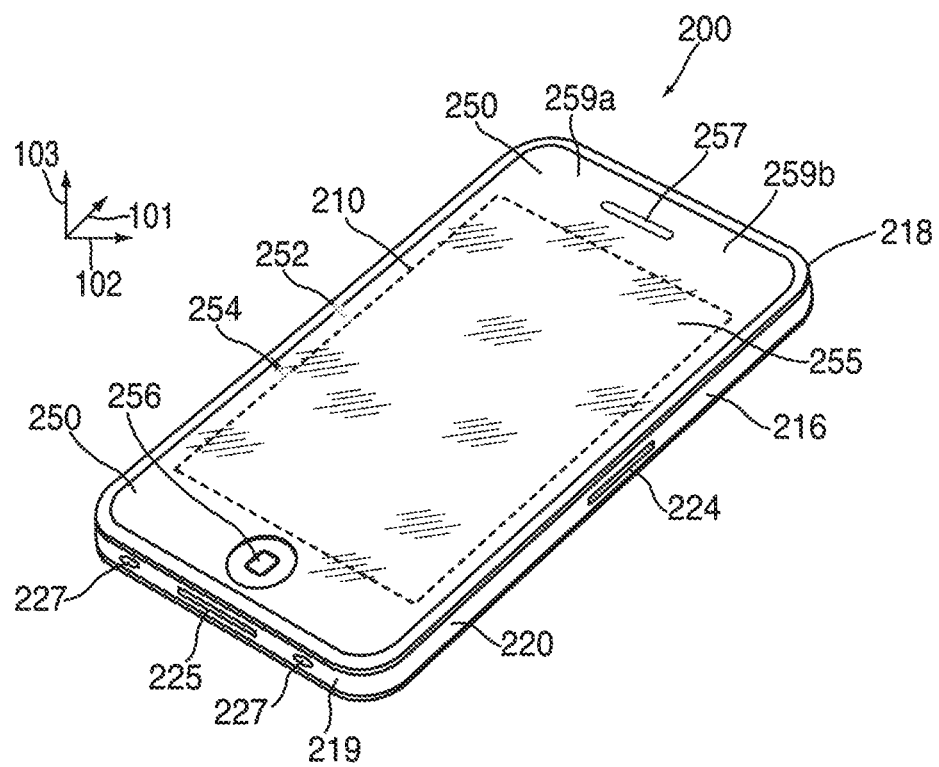
Figure 2C:
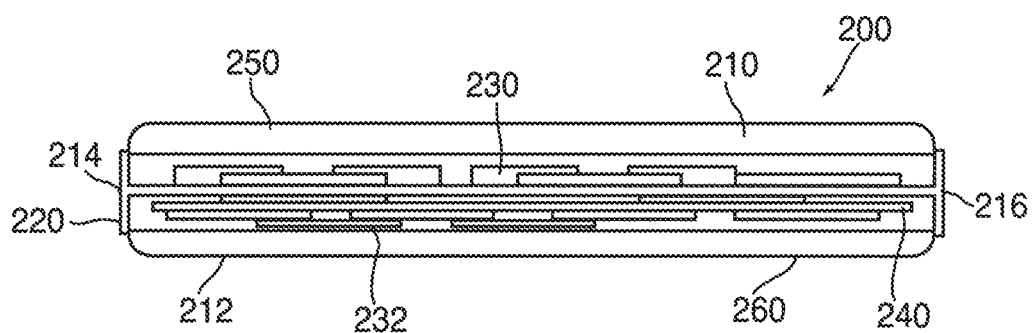

FIG. 2A is a schematic perspective view of an illustrative electronic device in accordance with one embodiment. FIG. 2B is an exploded view of the electronic device of FIG. 2A in accordance with one embodiment. FIG. 2C is a cross-sectional view of the electronic device of FIG. 2A in accordance with one embodiment. The electronic device of FIGS. 2A-2C can include some or all of the features of the electronic device of FIGS. 1A-1D. In particular, components having similar numbers can share some or all features. Outer periphery member 220 can surround the periphery of electronic device 200 to form some or all of the outer-most side, top and bottom surfaces (e.g., surfaces 210, 212, 214, 216, 218 and 219) of the electronic device. Outer periphery member 220 can have any suitable shape, including for example one or more elements that can be combined to form a ring. The ring-shape of outer periphery member 220 can enclose volume 222 in which electronic device components can be assembled and retained. The shape of outer periphery member 220 can define the boundaries of volume 222, and therefore can be determined based on the size and type of components placed within volume 222. The boundaries of volume 222 (e.g., determined by the shape of outer periphery member 220) can have any suitable shape, including for example a substantially rectangular shape (e.g., having straight or rounded edges or corners), a circular shape, an oval shape, a polygonal shape, or any other closed shape that can define a volume.

Outer periphery member 220 can have any suitable size, which can be determined based on any suitable criteria (e.g., aesthetics or industrial design, structural considerations, components requires for a desired functionality, or product design). The outer periphery member can have any suitable cross-section, including for example a variable cross-section or a constant cross-section. In some embodiments, the cross-section of the ring can be selected based on desired structural properties for the outer periphery member. For example, the cross-section of outer periphery member 220 can be substantially rectangular, such that the height of the outer periphery member is substantially larger than the width of the outer periphery member. This can provide structural stiffness in compression and tension, as well as bending.

In some embodiments, the dimensions of the outer periphery member cross-section can be determined relative to the dimensions of the internal platform cross section. For example, the outer periphery member height can be in a range of 5 to 15 times the height of the internal platform, for example 8 to 12 times, 9 to 11 times, or approximately 10 times the height of the internal platform. In one implementation, the height of the outer periphery member can be approximately 9 mm, and the height of the internal platform can be approximately 0.9 mm.

As another example, the width of the outer periphery member can be in a range of 8 to 25 times the width of the internal platform, for example 12 to 20 times, 15 to 18 times, or approximately 16 times the internal platform width. For example, the width of the outer periphery member can be 3 mm and the width of the internal member can be 50 mm. In some embodiments, the height of the internal platform can be related to the width of the outer periphery member. For example, the width of the outer periphery member can be 1 to 8 times the height of the internal platform, such as 2 to 6 times or approximately 4 times the height of the internal platform. In one implementation, the height of the internal platform can be approximately 0.7 mm and the width of the outer periphery member can be approximately 2.5 mm. In some embodiments, the height of the outer periphery member can be related to the width of the internal platform. For example, the width of the internal platform can be 3 to 10 times the height of the outer periphery member, such as 4 to 8 times, 5 to 7 times, or approximately 6 times the height of the outer periphery member. For example, the width of the internal platform can be approximately 5.5 mm and the height of the outer periphery member can be approximately 0.9 mm.

In some embodiments, outer periphery member 220 can include one or more openings, knobs, extensions, flanges, chamfers, or other features for receiving components or elements of the device. The features of the outer periphery member can extend from any surface of the outer periphery member, including for example from internal surfaces (e.g., to retain internal components or component layers), or from external surfaces. In particular, outer periphery member 220 can include a slot or opening 224 for receiving a card or tray within the device. Opening 224 can be aligned with one or more internal components operative to receive and connect to an inserted component (e.g., an inserted SIM card). As another example, outer periphery member 220 can include connector opening 225 (e.g., for a 30-pin connector) through which a connector can engage one or more conductive pins of electronic device 200. Outer periphery member 220 can include openings 226 and 227 for providing audio to a user (e.g., an opening adjacent to a speaker), or receiving audio from a user (e.g., an opening adjacent to a microphone). Outer periphery member 220 can instead or in addition include an opening for an audio connector or power supply (e.g., opening 228), or features 229 for retaining and enabling a button such as a volume control or silencing switch.

The various features of outer periphery member 220 can be constructed using any suitable approach and at any suitable time. In some embodiments, the features can be constructed as part of a process that creates outer periphery member 220 from a single piece of material that is manufactures into the final shape of outer periphery member 220 (e.g., using a machining process). In some embodiments, several pieces of material can instead or in addition be shaped individually and combined into outer periphery member 220. The various features can then be created as part of each individual piece, or once the entire outer periphery member has been assembled. Outer periphery member 220 can be constructed from any suitable material, including for example a metal (e.g., steel or aluminum), plastic (e.g. polyurethane, polyethylene or polycarbonate), composite material, or any combination thereof. In some embodiments, outer periphery member 220 can be constructed from the combination of several materials.

In some embodiments, outer periphery member 220 can have a functional use or purpose in addition to serving as a cosmetic component or as a structural component. For example, outer periphery member 220 can be used as part of an antenna for capturing electromagnetic waves radiated as part of a communications network. In some cases, outer periphery member 220 can be used as parts of more than one antenna.

In some embodiments, one or more portions of outer periphery member 220 can be treated to provide an aesthetically pleasing component. In particular, left surface 214, right surface 216, top surface 218, and bottom surface 219 can be treated using a cosmetic surface treatment such as, for example, polishing, coating (e.g., using a dye or coloring material, or a material providing an optical effect), glazing, thin film deposition, grinding, superfinishing, or any other suitable process. In some embodiments, front or back surfaces of outer periphery member 220 can instead or in addition be provided with a cosmetic treatment (e.g., for regions of the outer periphery member that may not be covered by back and front cover assemblies 250 and 260).

To reduce the overall weight, size or both of electronic device 200, the thickness of outer periphery member 220 can be selected such that outer periphery member 220 is only minimally resistant to one or more of bending, torsion, tension, compression, or other deformation of the band. For example, outer periphery member 220 can be more resistant to tension and compression, but less resistant to bending or torsion. To provide sufficient resistance to all types of deformation, electronic device 200 can include a structural component placed within volume 222. In some embodiments, one or more of the internal components of the electronic device can be connected to the outer periphery member and serve as a structural component. For example, a circuit board (with or without a separate stiffening element) can be connected to opposite portions of outer periphery member 220. Alternatively, a distinct and dedicated structural component can be coupled to outer periphery member 220. In the example of FIGS. 2A-2C, electronic device 200 can include internal platform 240 forming a distinct structural component of the electronic device. Internal platform 240 can include any suitable shape, including for example a substantially planar shape. In some embodiments, internal platform 240 can include several distinct regions, such as a primary region and step regions extending from the primary region to engage one or more features of outer periphery member 220.

Internal platform 240 can cover any suitable area within volume 222. Internal platform 240 can include any suitable features for securing or connecting electronic device components, such as one or more snaps, prongs, chamfers, extends, openings, access points, doors, or combinations of these. In some cases, internal platform 240 can include one or more dedicated features for receiving or securing specific electrical components, such as speakers, microphones, audio jacks, cameras, light sources, chips, or combinations of these.

Internal platform 240 can be constructed using any suitable approach. In some embodiments, internal platform 240 can be constructed from a single material or as a combination of several materials. For example, internal platform 240 can include one or more metal elements (e.g., included in extensions used to connect internal platform 240 to outer periphery member 220) around which a plastic can be molded to form internal platform 240. Some portions of the metal elements of internal platform 240 can extend beyond the edges of the plastic periphery so that the internal platform can be coupled to the outer periphery member via the metal elements. For example, the exposed metal elements can be connected to the outer periphery member using welding, soldering, heat staking, an adhesive, tape, a fastener, or any other connection mechanism. The outer periphery member can include one or more counterpart features on internal surfaces of the outer periphery member for retaining or receiving internal platform 240. The connection between the metallic portions of internal platform 240 and outer periphery member 220 can serve to ground particular electronic device components (e.g., components 230 and 232).

Internal platform 240 can be coupled to any suitable portion of outer periphery member 220. For example, internal platform 240 can be assembled within the height of outer periphery member 220 (e.g., based on the position of contact points or regions of the outer periphery member). The distribution of the contact points can be selected based on structural considerations, including for example based on a desired resistance to torsion or bending. In particular, the electronic device can include at least four contact points or regions distributed within outer periphery member 220 (e.g., near the corners of the outer periphery member). As another example, internal platform 240 can include contact regions along the straight portions of outer periphery member 220. As still another example, stepped regions of internal platform 240 can be coupled to the front or back surfaces of outer periphery member 220 (e.g., on opposite portions of the front or back surfaces).

In some embodiments, internal platform 240 can be placed within the height of outer periphery member 220 such that components 230 and 232 can be placed on both the front and back surfaces of internal platform 240. For example, components 230 can be inserted from back surface 212, and components 232 can be inserted from front surface 210. Components 230 and 232 can be coupled to internal platform 240 for security, and can instead or in addition be electrically connected to each other through an opening in internal platform 240. In some embodiments, some components 230 and 232 can first be coupled to back and front cover assemblies 250 and 260, respectively, before being inserted in volume 222 and coupled to outer periphery member 220. In effect, by its position internal platform 240 can define back and front pockets or regions within volume 222 in which electronic device components can be placed. The size of each pocket or region can be determined based on any suitable criteria, including for example the number and size of components to place in each region, the required position of internal platform 240 relative to outer periphery member 220 (e.g., if available positions are limited due to structural requirements), or combinations of these.

To retain components within volume 232, electronic device 200 can include front cover assembly 250 and back cover assembly 260 providing the back and front surfaces of the electronic device, respectively. Each cover assembly can be coupled to outer periphery member 220 using any suitable approach, including for example using an adhesive, tape, mechanical fastener, hooks, tabs, or combinations thereof. In some embodiments, one or both of cover assemblies 250 and 260 can be removable, for example for servicing or replacing electronic device components (e.g., a battery). In some embodiments, cover assemblies 250 and 260 can include several distinct parts, including for example a fixed part and a removable part. The inner surfaces of front cover assembly 250 and back cover assembly 260 can include any suitable feature, including for example one or more ridges, hooks, tabs, extensions, or any combination thereof for retaining the covers or ensuring proper alignment of the covers. The features of cover assemblies 250 and 260 can interact with corresponding features of outer periphery member 220) or other components of the electronic device to ensure proper placement of the covers. Front cover assembly 250 and back cover assembly 260 can be positioned in any suitable manner relative to outer periphery member 220.

Back cover assembly and front cover assembly can be coupled to any suitable portion of outer periphery member. In some embodiments, back cover assembly and front cover assembly can be connected relative to outer periphery member in the same or different manners. In the example of electronic device, both back cover assembly and front cover assembly can be positioned over the back and front surfaces, respectively, of outer periphery member. In some embodiments, one or both of back cover assembly and front cover assembly can only partially cover back surface and front surface, respectively. For example, one or both of back cover assembly and front cover assembly can be placed within the periphery of outer periphery member (e.g., recessed within the outer periphery member).

Returning to electronic device 200 (FIGS. 2A-2C), back cover assembly 260 and front cover assembly 250 can be constructed from any suitable material or combination of materials. In some embodiments, each of cover assemblies 250 and 260 can be constructed by combining several distinct components. For example, one or both cover assemblies can include a transparent or translucent plate (e.g., a rectangular plate of glass). As another example, one or both cover assemblies can include a base or support structure constructed from one or more of a metal or plastic (e.g., aluminum) onto which a transparent component can be assembled. The transparent component can be assembled using any suitable approach, including for example such that one or more electronic device components can be visible through the transparent component (e.g., display circuitry), or can receive signals or detect a user's environment through the transparent component (e.g., sensors). Alternatively, one or more portions of the transparent plate can be rendered opaque (e.g., using an ink, or by placing a support structure behind the transparent plate) such that the transparent plate can primarily serve as a cosmetic component. The different components of each cover assembly can be assembled using any suitable approach, including for example using one or more of an adhesive, fastener, tape, interlocking components, overmolding or manufacturing process, or any combination of these.

In the example of FIGS. 2A-2C, front cover assembly 250 can include support structure 252 on which glass plate 254 is assembled. Support structure 252 can include one or more openings, including an opening through which display 255 can be provided. In some embodiments, support structure 252 and glass plate 254 can include openings for device components, such as button opening 256 and receiver opening 257. The size and shape of the openings can be selected using any suitable approach, including for example based on the size and shape of the device components placed in or underneath the openings (e.g., opening 256 can determined by the size of the button, while opening 257 can be determine from the size of the receiver, and acoustic considerations for providing sufficient audio to a user).

In some embodiments, glass plate 254 can include a cosmetic finish hiding from view internal components of the electronic device. For example, an opaque layer can be applied region 259 surrounding display 255 to hide from view the non-display portions of the display circuitry. Because one or more sensors may receive signals through glass plate 254, the opaque layer can be selectively removed, or selected to allow signals to pass through the glass plate to the sensor behind the plate. For example, glass plate 254 can include regions 259*a* and 259*b* through which sensors (e.g., a camera, infrared sensor, proximity sensor, or ambient light sensor) can receive signals.

In some embodiments, front cover assembly 250 can support or enable one or more interfaces by which a user can use the electronic device. For example, glass plate 254 can support a touch interface (e.g., a touch pad or a touch screen) for controlling electronic device processes and operations. As another example, front cover assembly 250 can include one or more buttons or sensors (described above) for interacting with the device. In some cases, buttons, switches or other interface elements can be instead or in addition incorporated in outer periphery member 220 or back cover assembly 260. Electronic device 200 can include any other suitable interface for interacting with a user, including for example display circuitry, a projector, audio output circuitry (e.g., speakers or a an audio port), a haptic interface (e.g., a motor for creating vibrations, or a power source for providing an electrical stimulus), or combinations of these.

To enhance the cosmetic or aesthetic appeal of electronic device 200, one or all of outer periphery member 220, front cover assembly 250 and back cover assembly 260 can be finished using an appropriate process. For example, one or more of polishing, coating (e.g., using a dye or coloring material, or a material providing an optical effect), glazing, thin film deposition, grinding, superfinishing, or any other suitable process can be applied to electronic device components. In some embodiments, one or more glass surfaces (e.g., of front cover assembly 250 or of back cover assembly 260) can be finished to provide an aesthetically pleasing appearance, for example using one or more masks, coatings (e.g., photochromatic or dichroic), ink layers, or combinations of these. The particular finishes applied to the glass surfaces of front cover assembly 250 and back cover assembly 260 can be selected so that front and back surfaces 214 and 216 have similar or different appearances. In some embodiments, a glass surface can be treated to resist wear or impacts (e.g., scratch resistance), oils from touching, or any other external force applied to the device.

Figure 3:
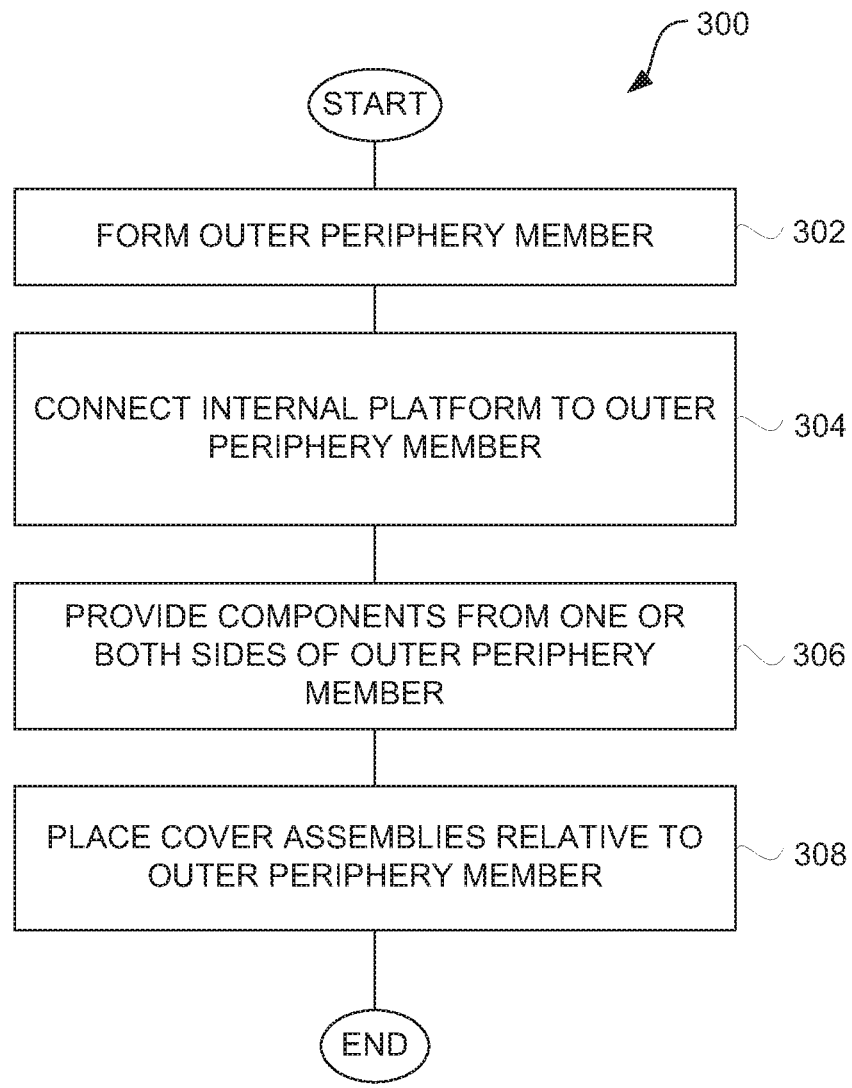
FIG. 3 is a flowchart of an illustrative process for assembling an electronic device in accordance with one embodiment of the invention.

FIG. 3 is a flowchart of an illustrative process for assembling an electronic device in accordance with one embodiment of the invention. Process 300 can begin at step 302, an outer periphery member having a closed loop can be obtained. For example, one or more components can be combined to form a loop. At step 304, an internal platform can be connected to the outer periphery member. For example, an internal member can be inserted within the loop of the band and connected to several portions of the outer periphery member to define a structural component. At step 306, components for the electronic device can be provided within a volume at least partially defined by the outer periphery member. The components can be provided within the volume from one or both sides of the outer periphery member. For example, components can be coupled to both sides of the internal platform. At step 308, cover assemblies can be placed relative to the outer periphery member. For example, front and back cover assemblies can be connected to the outer periphery member such that the inserted components are contained within an enclosure formed by the outer periphery member and the front and back cover assemblies. In particular, the front and back cover assemblies can be placed such that a display interface of the device remains visible through a window of one of the covers. Process 300 can then end after step 308.

For additional information on the electronic device structure and assembly processing discussed above in FIGS. 1-3, see U.S. Provisional Application No. 61/300,780, filed Feb. 2, 2010 and entitled "HANDHELD ELECTRONIC DEVICES," which is hereby incorporated herein by reference.

Alignment and Protection Arrangements and Techniques

With parts of an electronic device housing being arrangement in a stack, there can be cumulative tolerances which can make alignment less precise. According to one aspect, adjoining surfaces of electronic device housings can be mounted or arranged such that adjoining surfaces are flush to a high degree of precision. Edges of portable electronic devices are susceptible to impact force, such as when dropped. According to another aspect, protective sides can be provided on edges of electronic device housings so to dissipate impact forces and thus reduce damage to electronic device housings. According to still another embodiment, an electronic device housing can have one or more of its exposed major surfaces (e.g., front or back surfaces) formed of glass. The glass surfaces can be protected by the protective sides and can be aligned so that the top surfaces of the glass surfaces and the protective sides can be substantially flush.

Figure 4:
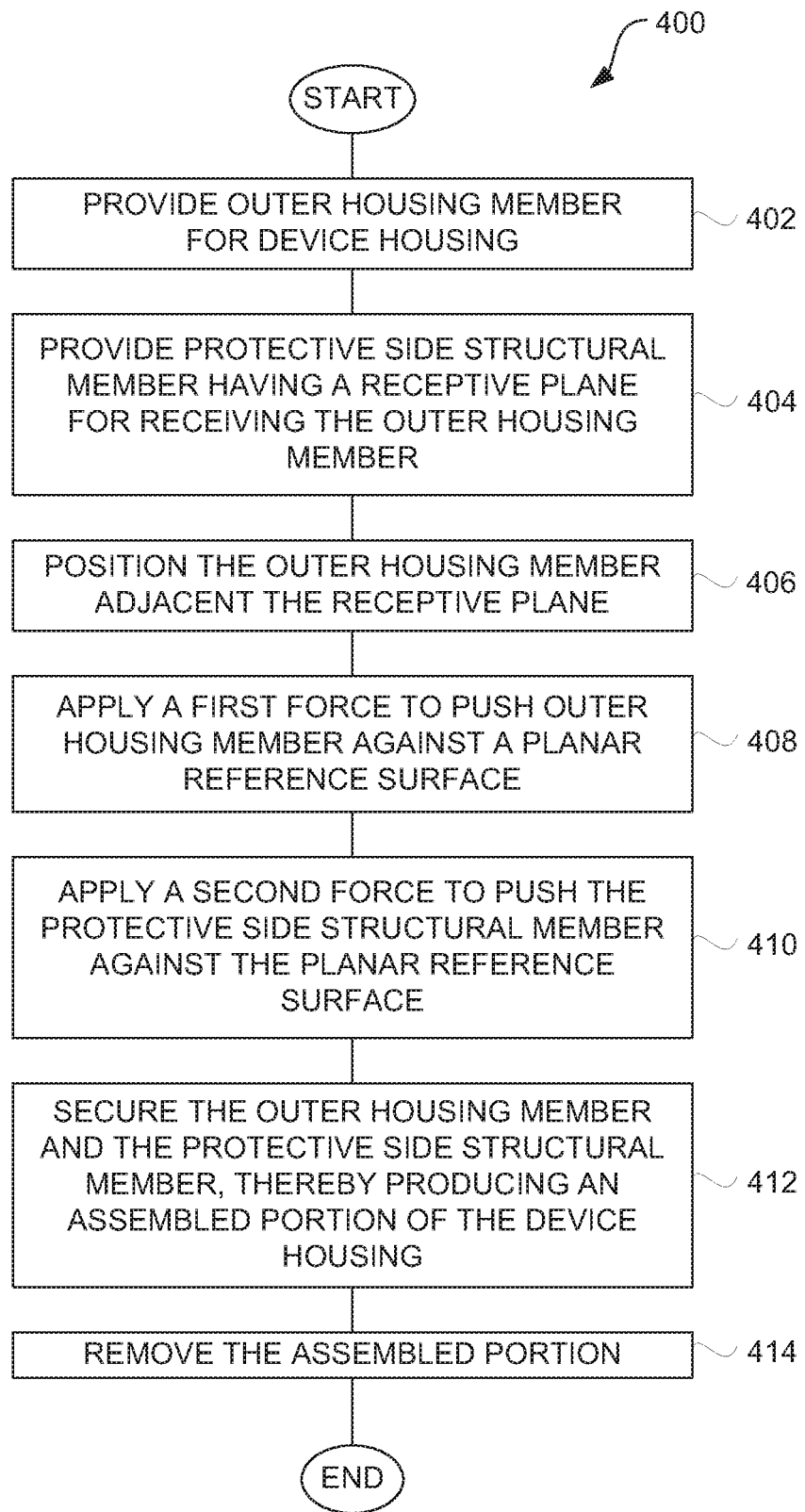
FIG. 4 is a flow diagram of a housing member alignment process according to one embodiment of the invention.

FIG. 4 is a flow diagram of a housing member alignment process 400 according to one embodiment of the invention. The housing member alignment process 400 serves to allow adjacent housing members to secured together while providing a flush interface therebetween.

The housing member alignment process 400 provides 402 an outer housing member for a device housing, namely, an electronic device housing, can be provided at an assembly region (e.g., assembly station). In addition, a protective side structural member having a receptive plane for receiving the outer housing member can be provided 404.

The outer housing member can be positioned 406 adjacent to the receptive plane of the protective side structural member. In order to ensure proper alignment to a high degree of flushness, a first force is applied 408 to push the outer housing member against a planer reference surface. Here, the planer reference surface can pertain to a flat steel surface provided at the assembly region. In one implementation, the planer reference surface can be coated with a non-stick coating (e.g. Teflon). Further, a second force can be applied 410 to push the protective side structural member against the planar reference surface. Typically, the second force can also push the protective side structural member against the outer housing member. The protective side structural member can then be secured 412 to the outer housing member. As a result, the outer housing member and the protective side structural member, once secured 412, can represent an assembled portion of the device housing. Thereafter, the assembled portion can be removed 414 from the assembly region. After the assembled portion has been removed 414, the housing member alignment process 400 can end.

Figure 5:
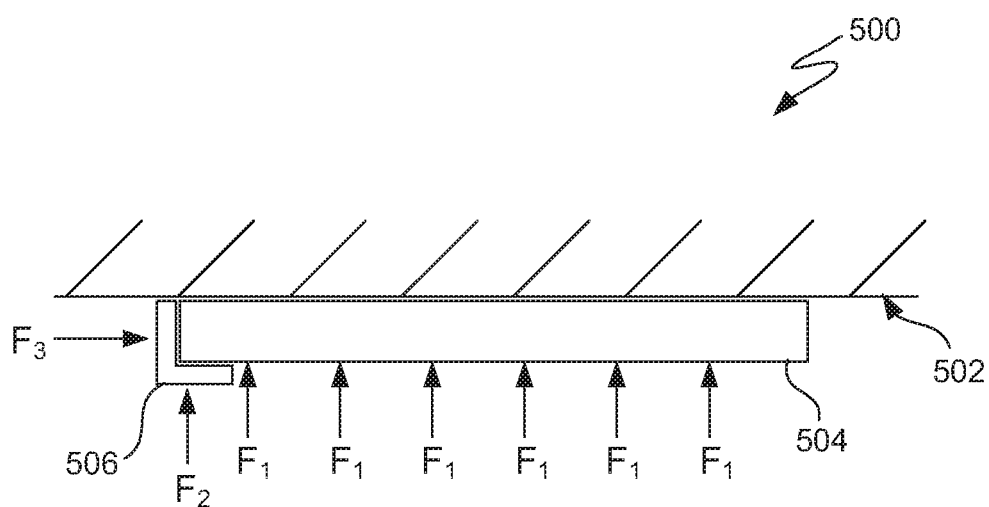
FIG. 5 is a structural diagram of an alignment configuration according to one embodiment.

FIG. 5 is a structural diagram of an alignment configuration 500 according to one embodiment. The alignment configuration 500 can correspond to alignment of adjacent housing members as discussed above, such as in the housing member alignment process 400 illustrated in FIG. 4. The alignment configuration 500 includes a planar reference surface 502 that is secured in a fixed manner. An outer housing member 504 can be pushed against the planar reference surface 502 by a force F1. The force F1, as shown in FIG. 5, can be applied at various points on an opposing surface of the outer housing member 504. For example, in this arrangement, a top surface of the outer housing member 504 can be pressed against a surface of the planar reference surface 502, and the force F1 can be induced on a bottom surface of the outer housing member 504. The force F1 can be applied as a single structure (e.g., spring) or be a plurality of structures (e.g., series of springs). The use of a plurality of springs can provide more uniform application of force across the surface of the outer housing member 504. In addition, a protective side structural member 506 can be provided adjacent to at least one side of the outer housing member 504. To position the protective side structural member 506 with respect to the outer housing member 504, in a flush manner, a force F2 can operate to push the protective side structural member 506 against the surface of the planar reference surface 502. The force F2 can be applied as a single structure (e.g., spring) or be a plurality of structures (e.g., series of springs). This insures that the top surface of the protective side structural member 506 will be positioned such that its top surface is flush with the top surface of the outer housing member 504. Additionally, if needed, a force F3 can be applied to push the protective side structural member 506 against the side of the outer housing member 504. Once the outer housing member 504 and the protective side structural member 506 are biased against the planar reference surface 502, the outer housing member 504 and the protective side structural member 506 can be secured to one another. These members of the electronic device housing can be secured together in a variety of different ways. For example, these members can be held together by an adhesive, such as glue or epoxy, which can remained biased against the planar reference surface 502 while the adhesive cures. As another example, these members can be held together through mechanical structures (e.g. screws, snaps, tabs, detents, etc.).

Figure 6:
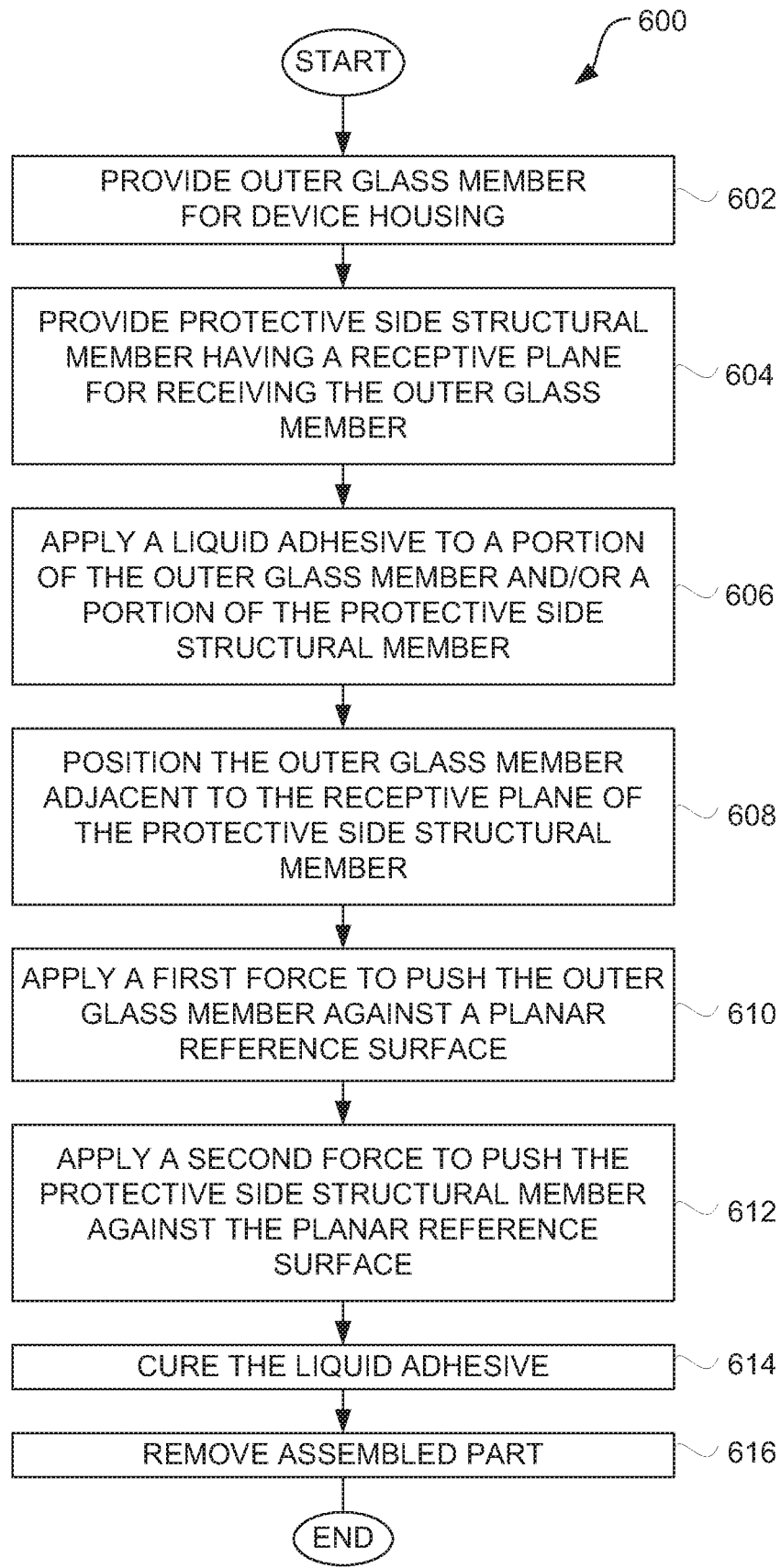
FIG. 6 is a flow diagram of a housing member alignment process according to one embodiment of the invention.

FIG. 6 is a flow diagram of a housing member alignment process 600 according to one embodiment of the invention. The housing member alignment process 600 can combine together an outer housing member (namely, an outer glass member) and a protective side structural member for an electronic device housing. The housing member alignment process 600 operates to align external surface of these members and then secure the members to one another.

The housing member alignment process 600 can provide 602 an outer class member for an electronic device housing. A protective side structural member having a receptive plane for receiving the outer glass member can also be provided. A liquid adhesive can then be applied 606 to a portion of the outer glass member and/or a portion of the protective side structural member. The outer glass member can then be positioned 608 adjacent to the receptive plane of the protective side structural member. To impose accurate alignment that yields a high degree of flushness, a first force can be applied 610 to push the outer glass member against a planar reference surface. A second force can also be applied 612 to push the protective side structural member against the planar reference surface. This ensures that the outer glass member and the protective side structural member are positioned such that a top surface of both are tightly adjacent and flush. Thereafter, the liquid adhesive can be cured 614. For example, the members being assembled together into an assembled part can be placed in an oven to accelerate the curing of the liquid adhesive. Once the protective side structural member and the outer glass member are secured by the cured adhesive, the assembled part can be removed 606 from the oven and the first and second forces can be removed. At this point, the assembled part includes the outer glass member together with the protective side structural member. Additionally, given the manner in which the members were assembled into the assembled part, the top surface of the outer glass member is flush with new top surface of the protective side structural member. Following the block 616, a housing member alignment process 600 can end.

In one embodiment, the flushness provided by the alignment processing can be not more than at most 80 mm from being precisely plush. In another embodiment, the flushness provided by the alignment processing can be not more than 60 mm from being precisely flush. In still another embodiment, the flushness provided by the alignment processing can be not more than 40 mm from being precisely flush.

FIGS. 7A-7D illustrate assembly of an assembled part according to one embodiment. The assembled part can be assembled in accordance with the housing member alignment process 600. The assembled part can represent a part for an electronic device housing.

Figure 7A:
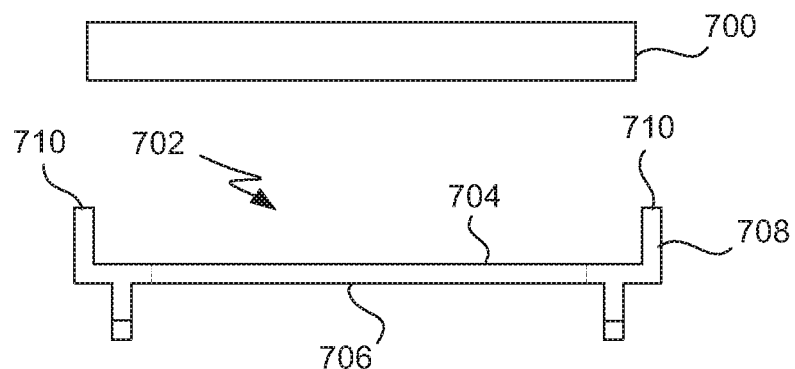
FIGS. 7A-7D illustrate assembly of an assembled part according to one embodiment.

FIG. 7A illustrates component members for the assembled part. Specifically, the component parts include an outer glass member 700 and a protective side structural member 702. The protective side structural member 702 has an upper surface 704 that can received the outer glass member 700 when assembled, and a bottom surface 706 that provides an inner surface for the electronic device housing. The protective side structural member 702 also includes side bumpers 708 that having top surfaces 710.

Figure 7B:
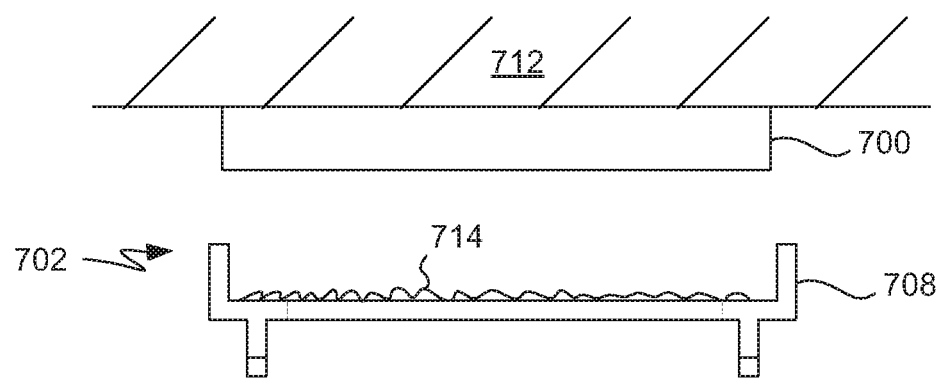

FIG. 7B illustrates an initial assembly step for the assembled part. The outer glass member 700 is held against a fixed reference structure 712. The top surface of the outer glass member 700 is pressed against a flat reference surface provided by the fixed reference structure 712. The output glass member 700 can be biased (i.e., pressed) against the flat reference surface by a mechanical member (e.g., spring (s)) that provides a biasing force. Additionally, the protective side structural member 702 can have liquid adhesive 714 deposited on a portion of the upper surface 704.

Figure 7C:
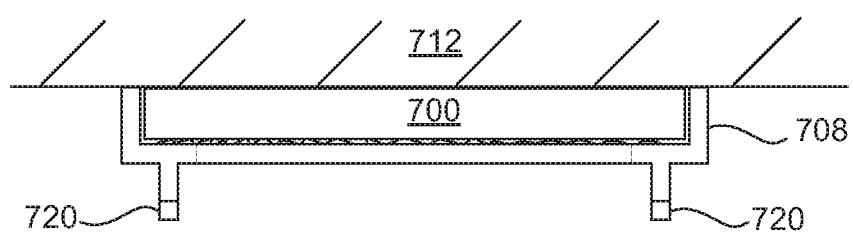

FIG. 7C illustrates a subsequent step for the assembled part. Here, the protective side structural member 702 with the liquid adhesive 714 can be pressed against the flat reference surface provided by the fixed reference structure 712. More specifically, the top surface 710 of the side bumpers 708 of the protective side structural member 702 is pressed against the flat reference surface. The protective side structural member 702 can be biased (i.e., pressed) against the flat reference surface by a mechanical member (e.g., spring(s)) that provide a biasing force. The protective side structural member 702 can be biased (i.e., pressed) against the flat reference surface by a mechanical member (e.g., spring(s)) that provide a biasing force. The mechanical member biasing the protective side structural member 702 is separate from the mechanical member biasing the outer glass member 700. Once the assembled part is held in position, as shown in FIG. 7C, by the biasing forces, the liquid adhesive can be cured. In one embodiment, the adhesive can be cured using heat, such as by placing the assembled part in an oven. The adhesive being cured serves to secure the parts (i.e., the outer glass member 700 and the protective side structural member 702) while compensating for tolerances of parts (e.g., in a component stack of parts) so that the top surface of the outer glass member 700 and the top surface 710 of the side bumpers 708 are flush. In one embodiment, flush means that the adjacent top surfaces are within 60 micrometers of being perfectly flush. Once the adhesive is cured, the heat can be removed and the assembled part is now assembled. Additionally, the side bumpers 708 of the protective side structural member 702 are tightly adjacent the sides (e.g., edges) of the outer glass member 700 and provide a barrier to impact forces at the sides of the glass member 700.

Figure 7D:
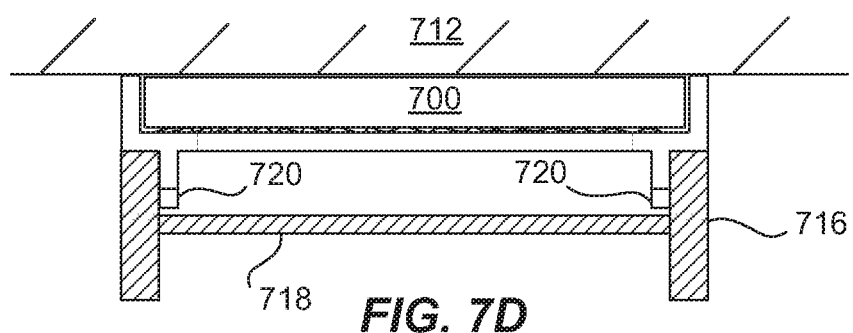

FIG. 7D illustrates a subsequent assembly for the assembled part. The assembled part can be attached to another structural component of the electronic device housing. As an example, the another structural component can pertain to an outer periphery member 716 for the electronic device housing. The outer periphery member 716 can define a side surface for the electronic device housing. The outer periphery member 716 can also attach or be integral with an internal structure 718 (e.g., internal platform) that provides structural stiffness for the electronic device housing. For example, the internal structure 718 can be secured to an inner surface of the outer periphery member 716. The internal structure 718 can be positioned offset from front and back planar boundaries of the outer periphery member 716. As shown in FIG. 7D, the assembled part can be coupled to the outer periphery member 716 at the front planar boundary. To secure the assembled part, the protective side structural member 702 can further include or couple to attachment arms 720. The attachment arms 720 can abut against an inner surface of the outer periphery member 716 and be secured thereto by adhesive or mechanical means (e.g., screws, tabs, snaps, etc.).

The assembled part can have parts of glass, polymer and/or metal. In one particular embodiment, the outer glass member 700 is glass, such as alumino-silicate glass; the protective side structural member 702 is polymer, such as polyarylamide; and the outer periphery member 716, the internal structure 718 and the attachment arms can be metal, such as stainless steel.

Figure 8A:
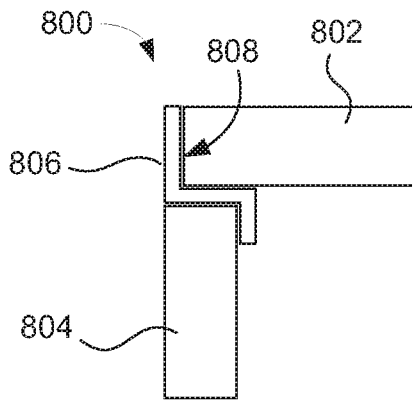
FIG. 8A is a side view of a partial side portion of an electronic device housing according to one embodiment.

FIG. 8A is a side view of a partial side portion of an electronic device housing 800 according to one embodiment. The partial side portion includes an outer housing member 802. The outer housing member 802 can abut against a side member 804. In addition, a protective side bumper 806 can be provided to protect an otherwise exposed side 808 of the outer housing member 802. The configuration of the protective side bumper 806 can vary with implementation. Typically, the thickness of the protective side bumper 806 is thin at the portion adjacent the exposed side 808. For example, where the thickness of the outer housing member 802 is 1 millimeter (mm), the thickness of the protective side bumper 806 can be less than 1 mm, more particularly the thickness can be about 0.8 mm. In one embodiment, the outer housing member 802 can be made of glass, the protective side bumper 806 can be made of a polymer, and the side member 804 can be made of metal.

Figure 8B:
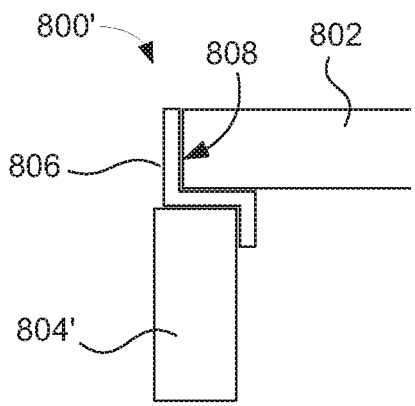
FIG. 8B is a side view of a partial side portion of an electronic device housing according to another embodiment.

FIG. 8B is a side view of a partial side portion of an electronic device housing 800' according to another embodiment. Similar to FIG. 8A, the outer housing member 802 can abut against a side member 804. The protective side bumper 806 can be provided to protect an otherwise exposed side 808 of the outer housing member 802. In this embodiment, the side member 804' can extend outward slightly from the outer surface of the protective side bumper 806. In one embodiment, the outer housing member 802 can be made of glass, the protective side bumper 806 can be made of a polymer, and the side member 804' can be made of metal.

Figure 8C:
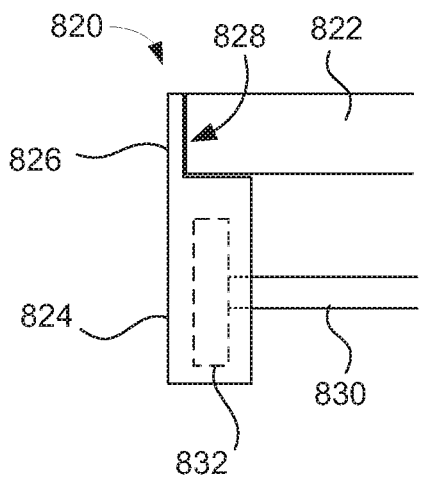
FIG. 8C is a side view of a partial side portion of an electronic device housing according to another embodiment.

FIG. 8C is a side view of a partial side portion of an electronic device housing 820 according to another embodiment. The partial side portion includes an outer housing member 822. The outer housing member 822 can abut against a side member 824. In this embodiment, the side member 824 supports the outer housing member 822 and also provide a protective side bumper 826 can be provided to protect an otherwise exposed side 828 of the outer housing member 822. The configuration of the protective side bumper 826 can vary with implementation. Typically, the thickness of the protective side bumper 806 is thin at the portion adjacent the exposed side 828. For example, where the thickness of the outer housing member 822 is 1 millimeter (mm), the thickness of the protective side bumper 826 can be less than 1 mm, more particularly the thickness can be about 0.8 mm. The side member 824 can couple to an internal structure 830 to provide support for the side member 824 of the electronic device housing. The internal structure 830 can, in one embodiment, include a side portion 832 embedded in the side member 824. In one embodiment, the outer housing member 822 can be made of glass, the side member 824 as well as the protective side bumper 826 can be made of a polymer, and the internal structure 830 (including side structure 832) can be made of metal.

Figure 8D:
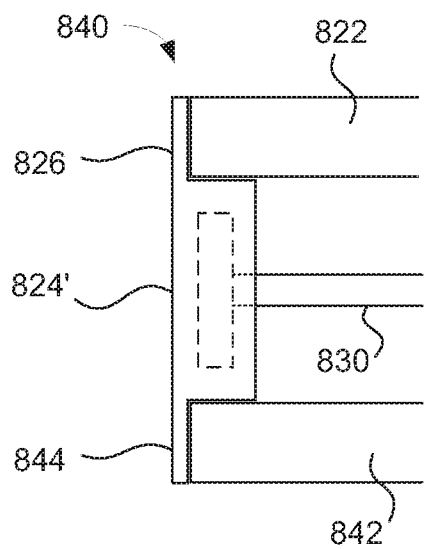
FIG. 8D is a side view of a partial side portion of an electronic device housing according to still another embodiment.

FIG. 8D is a side view of a partial side portion of an electronic device housing 840 according to still another embodiment. The electronic device housing 840 is similar to the electronic device housing 820 illustrated in FIG. 8C but provides another outer housing member 842. For example, the outer housing member 822 can correspond to a top cover for the electronic device housing, and the outer housing member 842 can correspond to a bottom cover for the electronic device housing. The side member 824' includes not only the protective side bumper 826 but also a protective side bumper 844.

Figure 9A:
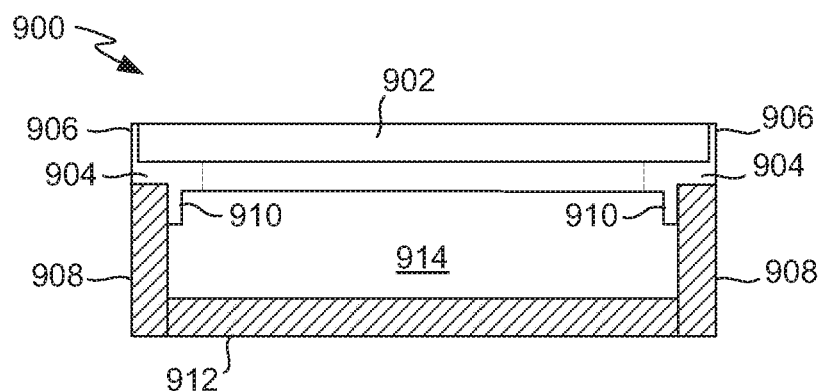
FIG. 9A is a cross-sectional view of an electronic device housing according to one embodiment.

FIG. 9A is a cross-sectional view of an electronic device housing 900 according to one embodiment. The electronic device housing 900 includes an outer housing member 902 supported and protected by an interface member 904. The interface member 904 providing protective side members 906 (e.g., protective side bumpers) positioned tightly adjacent sides of the outer housing member 902. The interface member 904 also supports the outer housing member 902 and serves to secure the outer housing member 902 to other portions of the electronic device housing 900. In this embodiment, the interface member 904 is secured to an outer periphery member 908. More particularly, in this embodiment, the interface member 904 includes securing features 910 (e.g., attachment arms) that are used to secure the interface member 904 (and thus the outer housing member 902) to the outer periphery member 908. The electronic device housing 900 can also include another outer housing member 912. The another outer housing member 912 can, for example, be integral with or secured to the outer periphery member 908 on a side opposite the outer housing member 902. An internal space 914 is provided internal to the electronic device housing 900 whereby various electrical components can be attached, affixed or placed so as to provide electronic operations for the electronic device.

The various members, parts or assemblies of the electronic device housing 900 can be formed of any of a variety of materials, e.g., glass, polymers or metal. In one embodiment, the outer housing member 902 is glass, the outer periphery member 908 is formed from metal or polymer (e.g., plastic), and the another outer housing member 912 is formed from glass, polymer (e.g., plastic) or metal. The interface member 904 can be formed of a polymer or from a combination of materials. For example, the protective side members 906 are to be strong; hence, a structurally strengthened polymer, such as polyarylamide, can be utilized. Also as an example, the securing features 910 can be formed from metal for increased strength. The securing features 910 if formed of metal can be combined with the balance of the interface member 904 by an over-molding process.

Figure 9B:
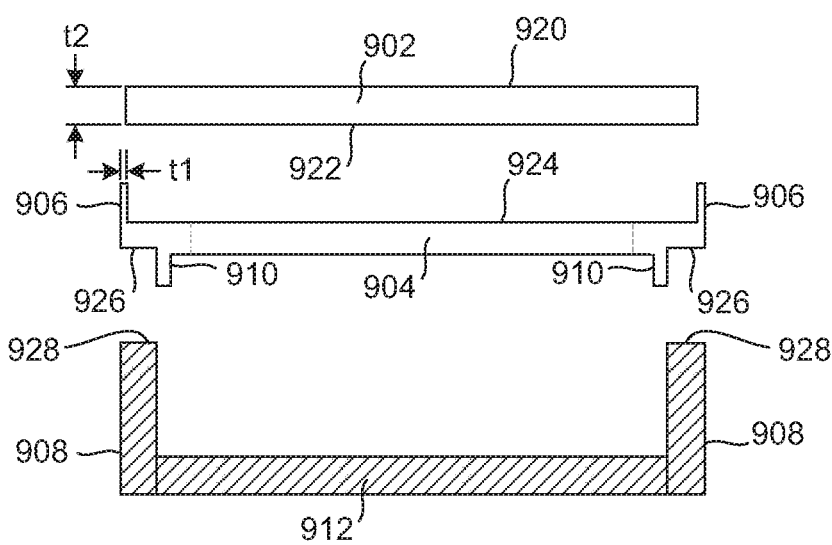
FIG. 9B is a cross-sectional assembly diagram for the electronic device housing shown in FIG. 9A, according to one embodiment.

FIG. 9B is a cross-sectional assembly diagram for the electronic device housing 900 shown in FIG. 9A, according to one embodiment. The outer housing member 902 has a top surface 920 and a bottom surface 922. The bottom surface 922 of the outer housing member 902 can be secured to a top surface 924 of the interface member 904. For example, the outer housing member 902 can be secured to the top surface 924 of the interface member 904 using adhesive. When the outer housing member 902 is secured to the interface member 904, the protective side members 906 are positioned at the sides (i.e., edges) of the outer housing member 902. The protective side member 906 provides a buffer layer (e.g., bumper) that dampens impact induced at the sides of the outer housing member 902 of the electronic device housing 900. In addition, a bottom surface 926 of the interface member 904 is placed on a top surface 928 of the outer periphery member 908. The securing features 910 of the interface member 904 can be used to secure the interface member 904 to the outer periphery member 908.

Figure 10:
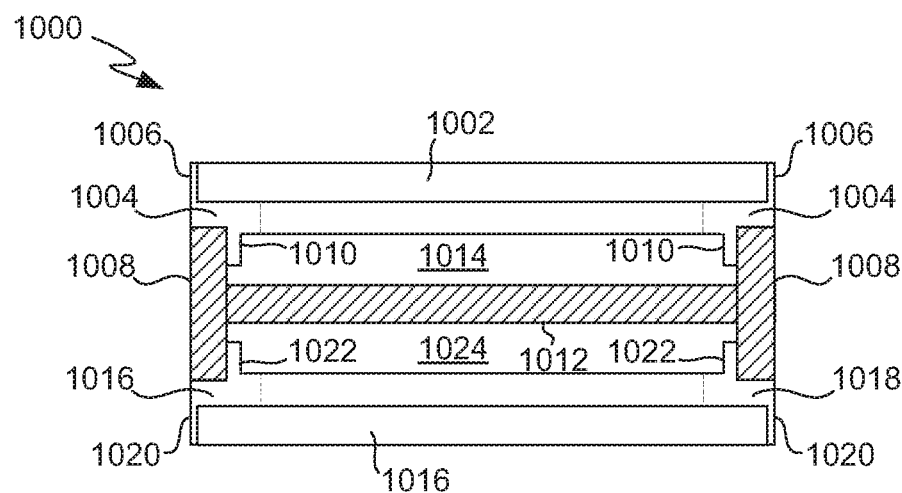
FIG. 10 is a cross-sectional view of an electronic device housing according to one embodiment.

FIG. 10 is a cross-sectional view of an electronic device housing 1000 according to one embodiment. The electronic device housing 1000 includes a first outer housing member 1002 supported and protected by a first interface member 1004. The first interface member 1004 provides protective side members 1006 (e.g., protective side bumpers) positioned tightly adjacent sides of the first outer housing member 1002. The first interface member 1004 also supports the first outer housing member 1002 and serves to secure the first outer housing member 1002 to other portions of the electronic device housing 1000. In this embodiment, the first interface member 1004 is secured to an outer periphery member 1008. More particularly, in this embodiment, the first interface member 1004 includes first securing features 1010 that are used to secure the first interface member 1004 (and thus the first outer housing member 1002) to the outer periphery member 1008.

The electronic device housing 1000 can also include an internal structure 1012 that is integral with or secured to the outer peripheral member 1008. In one embodiment, the internal structure 1012 can be secured to an inner surface of the outer periphery member 1008 such that it is offset from front and back planar boundaries of the outer periphery member 1008. As shown in FIG. 10, the internal structure 1012 can be secured at the mid-point of the height of the outer periphery member 1008. A first internal space 1014 is provided internal to the electronic device housing 1000 whereby various electrical components can be attached, affixed or placed so as to provide electronic operations for the electronic device.

In this embodiment, the electronic device housing 1000 also includes similar structure on an opposite side of the electronic device housing 1000. Namely, the electronic device housing 1000 can further include a second outer housing member 1016 supported and protected by a second interface member 1018. The second interface member 1018 provides protective side members 1020 (e.g., protective side bumpers) positioned tightly adjacent sides of the second outer housing member 1016. The second interface member 1018 also supports the second outer housing member 1016 and serves to secure the second outer housing member 1016 to other portions of the electronic device housing 1000. In this embodiment, the second interface member 1018 can be secured to the outer periphery member 1008 on the opposite side from the first interface member 1004. More particularly, in this embodiment, the second interface member 1018 includes second securing features 1022 (e.g., attachment arm) that are used to secure the second interface member 1018 (and thus the second outer housing member 1016) to the outer periphery member 1008. Further, a second internal space 1024 is provided internal to the electronic device housing 1000 (between the internal structure 1012 and the second interface member 1018) whereby various electrical components can be attached, affixed or placed so as to provide electronic operations for the electronic device.

In one embodiment, the first outer housing member 1002 can represent a top outer surface for the portable electronic device, and the second outer surface housing 1016 can represent a bottom outer surface housing. In one embodiment, both the first outer housing member 1002 and the second outer housing member 1016 are glass (e.g., class covers).

In FIGS. 9A, 9B and 10, the protective side members (e.g., protective side bumpers) are thin layer of material positioned tightly adjacent sides of the outer housing member, thereby buffering impact at the sides of the outer housing members. In one embodiment, the protective side members are to be strong; hence, a structurally strengthened polymer, such as polyarylamide, can be utilized. The polyarylamide can be strengthened by containing glass fibers. One source of strengthened polyarylamide is Ixef polyarylamide (PARA) from Solvay Advanced Polymers, L.L.C which can contain glass fiber reinforcement. Additionally, since the protective side members are tightly adjacent sides of the outer housing member, the respective materials used for the protective side members and the outer housing member. Specifically, the Coefficient of Thermal Expansion (CTE) of the respective materials, if not controlled, can produce undesired stress on the sides of the outer housing member. For example, with an outer housing member of glass, its CTE is about 10 millimeters/meter/.degree. C. Hence, ideally, for this example the CTE of the material for the protective side members would be about 10 millimeters/meter/.degree. C. Although plastics tend to have CTE's (e.g., roughly 100 millimeters/meter/.degree. C.) that are dramatically higher than that of glass, some manufactured polymers, such as polyarylamide, can have CTE's (e.g., roughly 30 millimeters/meter/.degree. C.) that are substantially closer to that of glass and thereby would, if used, induce less stress on the sides of the outer housing member. For example, in one embodiment, a manufactured polymer for such use could have a CTE less than or equal to about 50 millimeters/meter/.degree. C., and in another embodiment, a manufactured polymer for such use could have a CTE less than or equal to about 35 millimeters/meter/.degree. C. Also, as noted above, the thickness of the protective side member can be thin, for example, the thickness can be not more than about 1 mm in one embodiment.

In still other embodiments, the protective side materials can be formed from multiple materials that can be alternated, intertwined or layered. The later of material against the edges of the outer housing member of glass can have a CTE relatively close to that of glass while an outer layer can have a higher CTE can permit a greater range of material, such as polymers (e.g., plastics).

The protective side members are able to be thin yet be cosmetically unintrusive. For example, in some embodiments, the thickness (t1) for the protective side member can be less than 1 mm (e.g., 0.8 mm). Also, in some embodiments, the thickness (t2) of the outer housing member can be less than 5 mm (e.g., 1 mm). However, these thicknesses are exemplary and vary with the size of the electronic device housing and with desired strength. Using a strengthened material for the protective side members as noted above can also be advantageous. Nevertheless, the provisioning of thin protective side members for outer housing members, such as glass covers, facilitates providing portable electronic device housings that are compact and thin yet resistant to side impact damage to the outer housing members.

Figure 11A:
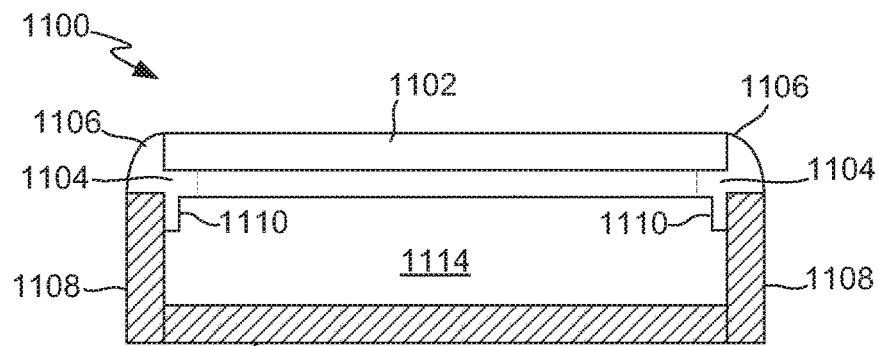
FIG. 11A is a cross-sectional view of an electronic device housing according to one embodiment.
Figure 11B:
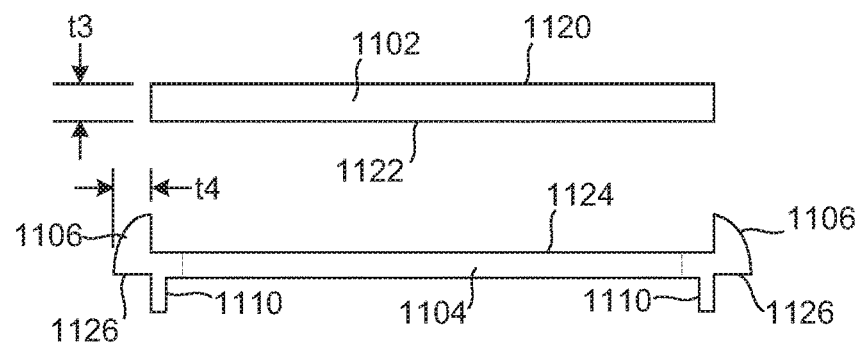
FIG. 11B is a cross-sectional assembly diagram for the electronic device housing shown in FIG. 11A, according to one embodiment.
Figure 11B:
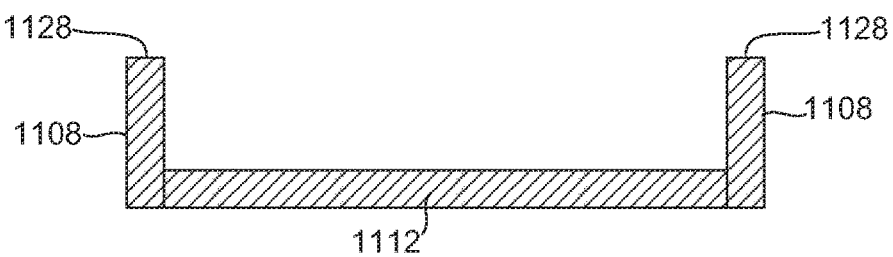
Figure 12:
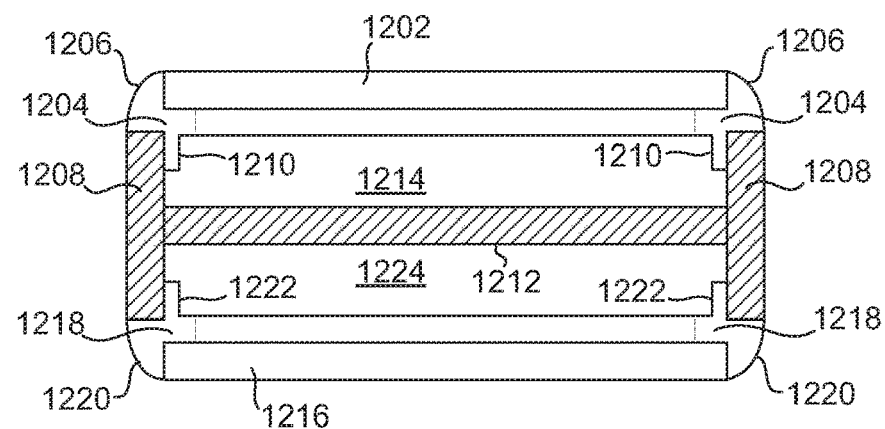
FIG. 12 is a cross-sectional view of an electronic device housing according to one embodiment.

FIGS. 11A, 11B and 12 are structurally similar to FIGS. 9A, 9B and 10, respectively. However, the configuration of the protective side members is different. The protective side members illustrated in FIGS. 11A, 11B and 12 form corners for the electronic device housing and, therefore, are typically thicker than the protective side members illustrated in FIGS. 9A, 9B and 10. As an example, in one embodiment, the thickness of the protective side member is approximately the thickness of the outer housing member.

FIG. 11A is a cross-sectional view of an electronic device housing 1100 according to one embodiment. The electronic device housing 1100 includes an outer housing member 1102 supported and protected by an interface member 1104. The interface member 1104 providing protective side members 1106 (e.g., protective side bumpers) positioned tightly adjacent sides of the outer housing member 1102. The interface member 1104 also supports the outer housing member 1102 and serves to secure the outer housing member 1102 to other portions of the electronic device housing 1100. In this embodiment, the interface member 1104 is secured to an outer periphery member 1108. More particularly, in this embodiment, the interface member 1104 includes securing features 1110 (e.g., attachment arms) that are used to secure the interface member 1104 (and thus the outer housing member 1102) to the outer periphery member 1108. The electronic device housing 1100 can also include another outer housing member 1112. The another outer housing member 1112 can, for example, be integral with or secured to the outer periphery member 1108 on a side opposite the outer housing member 1102. An internal space 1114 is provided internal to the electronic device housing 1100 whereby various electrical components can be attached, affixed or placed so as to provide electronic operations for the electronic device.

The various members, parts or assemblies of the electronic device housing 1100 can be formed of any of a variety of materials, e.g., glass, polymer or metal. In one embodiment, the outer housing member 1102 is glass, the outer periphery member 1108 is formed from metal or polymer (e.g., plastic), and the another outer housing member 1112 is formed from glass, polymer (e.g., plastic) or metal. The interface member 1104 can be formed of a polymer or from a combination of materials. For example, the protective side members 1106 are to be strong; hence, a structurally strengthened polymer, such as polyarylamide, can be utilized. The polyarylamide can be strengthened by containing glass fibers. Also as an example, the securing features 1110 can be formed from metal for increased strength. The securing features 1110 if formed of metal can be combined with the balance of the interface member 1104 by an over-molding process.

FIG. 11B is a cross-sectional assembly diagram for the electronic device housing 1100 shown in FIG. 11A, according to one embodiment. The outer housing member 1102 has a top surface 1120 and a bottom surface 1122. The bottom surface 1122 of the outer housing member 1102 can be secured to a top surface 1124 of the interface member 1104. For example, the outer housing member 1102 can be secured to the top surface 1124 of the interface member 1104 using adhesive. When the outer housing member 1102 is secured to the interface member 1104, the protective side members 1106 are positioned at the sides (i.e., edges) of the outer housing member 1102. The protective side member 1106 provides a buffer layer (e.g., bumper) that dampens impact induced at the sides of the outer housing member 1102 of the electronic device housing 1100. In addition, a bottom surface 1126 of the interface member 1104 is placed on a top surface 1128 of the outer periphery member 1108. The securing features 1110 of the interface member 1104 can be used to secure the interface member 1104 to the outer periphery member 1108.

FIG. 12 is a cross-sectional view of an electronic device housing 1200 according to one embodiment. The electronic device housing 1200 includes a first outer housing member 1202 supported and protected by a first interface member 1204. The first interface member 1204 provides protective side members 1206 (e.g., protective side bumpers) positioned tightly adjacent sides of the first outer housing member 1202. The first interface member 1204 also supports the first outer housing member 1202 and serves to secure the first outer housing member 1202 to other portions of the electronic device housing 1200. In this embodiment, the first interface member 1204 is secured to an outer periphery member 1208. More particularly, in this embodiment, the first interface member 1204 includes first securing features 1210 that are used to secure the first interface member 1204 (and thus the first outer housing member 1202) to the outer periphery member 1208.

The electronic device housing 1200 can also include an internal structure 1212 that is integral with or secured to the outer peripheral member 1208. In one embodiment, the internal structure 1212 can be secured to an inner surface of the outer periphery member 1208 such that it is offset from front and back planar boundaries of the outer periphery member 1208. As shown in FIG. 12, the internal structure 1212 can be secured at the mid-point of the height of the outer periphery member 1208. A first internal space 1214 is provided internal to the electronic device housing 1200 whereby various electrical components can be attached, affixed or placed so as to provide electronic operations for the electronic device.

In this embodiment, the electronic device housing 1200 also includes similar structure on an opposite side of the electronic device housing 1200. Namely, the electronic device housing 1200 can further include a second outer housing member 1216 supported and protected by a second interface member 1218. The second interface member 1218 provides protective side members 1220 (e.g., protective side bumpers) positioned tightly adjacent sides of the second outer housing member 1216. The second interface member 1218 also supports the second outer housing member 1216 and serves to secure the second outer housing member 1216 to other portions of the electronic device housing 1200. In this embodiment, the second interface member 1218 can be secured to the outer periphery member 1208 on the opposite side from the first interface member 1204. More particularly, in this embodiment, the second interface member 1218 includes second securing features 1222 (e.g., attachment arms) that are used to secure the second interface member 1218 (and thus the second outer housing member 1216) to the outer periphery member 1208. Further, a second internal space 1224 is provided internal to the electronic device housing 1200 (between the internal structure 1212 and the second interface member 1218) whereby various electrical components can be attached, affixed or placed so as to provide electronic operations for the electronic device.

In one embodiment, the first outer housing member 1202 can represent a top outer surface for the portable electronic device, and the second outer surface housing 1216 can represent a bottom outer surface housing. In one embodiment, both the first outer housing member 1202 and the second outer housing member 1216 are glass (e.g., class covers).

In FIGS. 11A, 11B and 12, the protective side members (e.g., protective side bumpers) are thin layer of material positioned tightly adjacent sides of the outer housing member, thereby buffering impact at the sides of the outer housing members. In these embodiments, the protective side members are rounded at corners of the electronic device housing. For example, in some embodiments, the thickness (t3) for the protective side member can be less than 5 mm (e.g., 1 mm). Also, in some embodiments, the thickness (t4) of the outer housing member can be less than 5 mm (e.g., 1 mm). However, these thicknesses are exemplary and vary with the size of the electronic device housing and with desired strength. Using a strengthened material for the protective side members as noted above can also be advantageous. Nevertheless, the provisioning of thin protective side members for outer housing members, such as glass covers, facilitates providing portable electronic device housings that are compact and thin yet resistant to side impact damage to the outer housing members.

Figure 13:
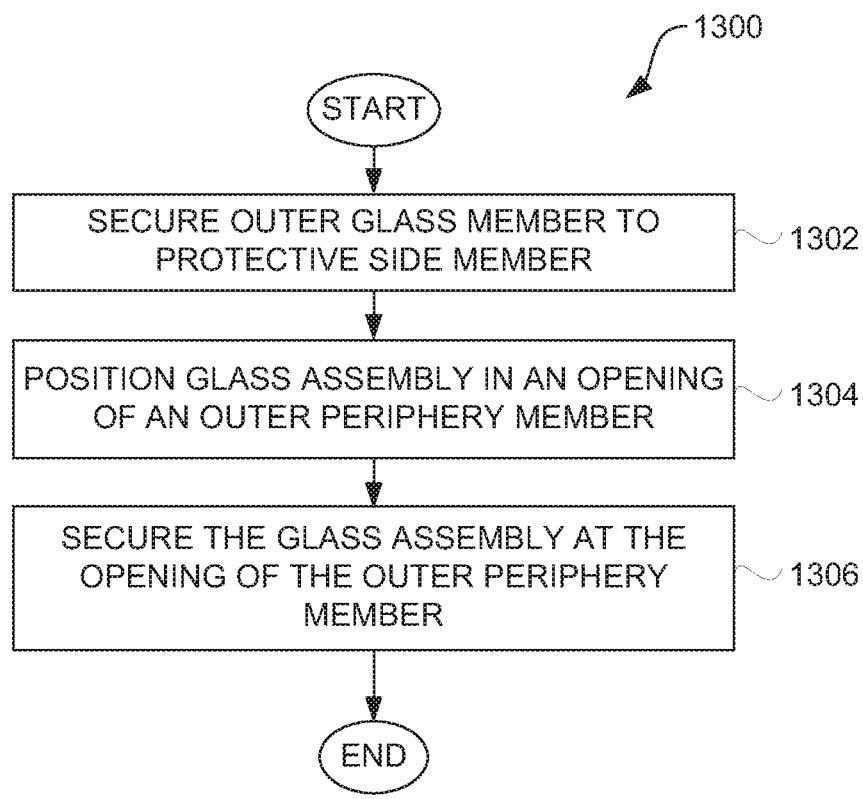
FIG. 13 is a flow diagram of an outer member assembly process according to one embodiment of the invention.

FIG. 13 is a flow diagram of an outer member assembly process 1300 according to one embodiment of the invention. In this example, the outer member is an outer glass member. The outer glass member can be secured 1302 to a protective side member. As an example, the processing performed to secure the outer glass member to the protective side member can, in certain embodiments, use the housing member alignment process 400, 600 illustrated in FIGS. 4 and 6, respectively.

After the outer glass member has been secured 1302 to the protective side member, the glass assembly can be positioned 1304 in an opening of an outer periphery member. After the glass assembly has been positioned, the glass assembly at the opening of the outer periphery member can be secured 1306. The glass assembly, namely, the outer glass member, can thus operate as an outer surface for the electronic device housing. Following the block 1306, the outer member assembly process 1300 can end.

In one embodiment, the outer glass member can represent a front (or top) surface of the electronic device housing. In another embodiment, the outer glass member can represent a back (or bottom) surface of the electronic device housing. In general, the outer member assembly process 1300 can represent processing suitable for any exposed surface of an electronic device housing that is formed of a glass member. In still another embodiment, the electronic device housing may utilize an outer glass member for a front surface of the electronic device housing and may utilize an outer glass member for a back surface of the electronic device housing.

As discussed above, such as in FIGS. 10 and 13, an electronic device housing can be substantially made of glass. For example, an electronic device housing might have at least 75% of its exterior as glass. In one implementation, front and bottom surfaces of an electronic device housing can be glass while side surface are some material other than glass (e.g., metal, plastic).

In the case of portable electronic devices, housings are banged against or rub against various surfaces. When plastic or metal housing surfaces are used, the surfaces tend to become scratched. On the other hand, with glass housing surfaces (e.g., glass covers), the surfaces are much more scratch resistant. Moreover, glass housing surfaces offer radio transparency, while metal housing surfaces disturb or hinder radio communications. In one embodiment, an electronic device housing can use glass housing members (e.g., glass covers) for a front surface and a back surface of the electronic device housing. For example, a front surface formed from a glass housing member can be transparent to provide visual access to a display device positioned behind the glass housing member at the front surface, while a back surface formed from a glass housing member can be transparent or non-transparent. Non-transparency, if desired, can conceal any interior components within the electronic device housing. In one embodiment, a surface coating or film can be applied to the glass housing member to provide non-transparency or at least partial translucency. Such a surface coating or file can be provided on an inner surface or an outer surface of the glass housing member. The protective side members and the interface members discussed herein can be optionally used to protect and/or assembly the glass housing members.

Figure 14:
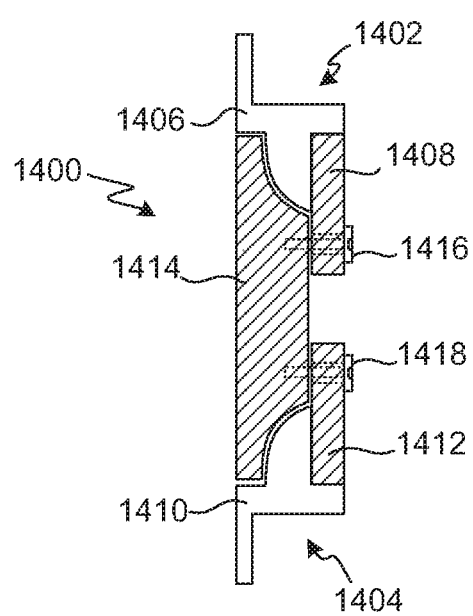
FIG. 14 is a side view of a partial side portion of an electronic device housing.

FIG. 14 is a side view of a partial side portion of an electronic device housing 1400. The partial side portion illustrates includes a first interface assembly 1402 and a second interface assembly 1404. The interface assemblies 1402, 1404 can also be referred to as interface members. The interface assembly 1402 includes a support and protection member 1406 and an attachment member 1408. Similarly, the interface assembly 1404 includes a support and protection member 1410 and an attachment member 1412. The support and protection members 1406 can support a first outer housing member and provide a protective side member therefore as discussed above. Similarly, the support and protection members 1410 can support a second outer housing member and provide a protective side member therefore as discussed above. The attachment member 1408 can serve to attach and secure the interface assembly 1402 to a side member 1414, and the attachment member 1412 can serve to attach and secure the interface assembly to the side member 1414. An attachment device 1416 (e.g., screw, bolt) can be provided to tightly secure the first support and protection member 1406 with respect to the side member 1414. Likewise, an attachment device 1418 (e.g., screw, bolt) can be provided to tightly secure the second support and protection member 1410 with respect to the side member 1414.

Although only a single attachment device 1416 is shown for the attachment member 1408, it should be understood that several attachment devices would ordinarily be used to reliable secure the first interface assembly 1402 to the side member 1414. Likewise, although only a single attachment device 1418 is shown for the attachment member 1412, it should be understood that several attachment devices would ordinarily be used to reliable secure the second interface assembly 1404 to the side member 1414. Also, although the embodiment illustrated in FIG. 14 supports outer housing member at opposite ends, it should be understood that in other embodiments the electronic device housing may only use a single outer housing member.

Attachment Structures and Techniques

According to another aspect, apparatus, systems and methods for robustly attaching a cover portion of an electronic device to a bottom portion, e.g., a housing portion, of the electronic device are described. The cover portion may generally include a frame (e.g., interface member) into which a glass member has been inserted. Attachment members (e.g., arms, tabs) can be coupled to, e.g., insert molded into, a cover portion, and can be arranged to substantially engage with a housing portion such that the cover portion is effectively held against the housing portion. The attachment members can be used to screw or otherwise fasten the cover portion to the housing. In general, receptacles of the housing portion are arranged to substantially capture, mate or otherwise engage attachment members of the cover portion.

In one embodiment, the cover portion is held against the housing portion such that a contact surface of the cover portion interfaces with a contact surface of the housing portion, e.g., such that there is effectively no gap between the contact surfaces. More generally, the cover portion may be held against the housing portion such that the size of any space between the contact surface of the cover portion and the contact surface of the housing portion may be controlled. For example, to hold the cover portion against the housing portion, a protrusion that is a part of or is otherwise attached to the cover portion can be engaged with a receptacle that is a part of or is otherwise attached on the housing portion.

The apparatus, systems, and methods of the present invention allow for the formation of a robust coupling between a cover of a device, such as a handheld electronic device, and a housing of such a device. Handheld electronic devices may generally include, but are not limited to including, mobile phones, media players, user input devices (e.g., mouse, touch sensitive devices), personal digital assistants, remote controls, electronic book readers, etc. The apparatus, systems, and methods may also be used for covers (e.g., covers with glass members), or displays for other relatively larger form factor electronic devices such as portable computers, tablet computers, displays, monitors, televisions, etc.

In general, a device that includes a cover which is securely held to a housing is relatively durable or robust. A secure coupling between the cover and the housing may be arranged in an interior volume of a device such that the coupling does not interfere with the exterior of the device. The aesthetic qualities of a device can be enhanced. In one embodiment, a cover and a housing interface together with substantially no gap space therebetween. More generally, the aesthetic or visual qualities of a device may be substantially improved by controlling the size of a gap between a cover and a housing when the cover and the housing are assembled. In addition, when the size of a gap between a cover and a housing may be substantially minimized, the profile of a device formed from the cover and the housing may be relatively thin.

Figure 15A:
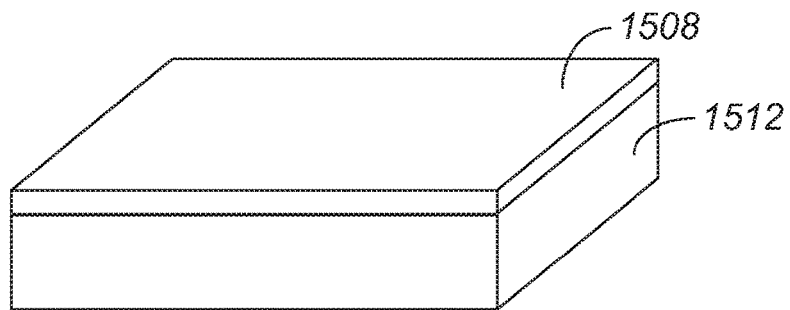
FIG. 15A is a diagrammatic perspective representation of a housing to which a cover is assembled in accordance with one embodiment.

FIG. 15A is a diagrammatic perspective representation of a housing to which a cover, e.g., a cover which includes a glass member held by a frame, is assembled in accordance with an embodiment of the present invention. An assembly 1502 includes a cover 1508 which is mounted or substantially secured to a housing 1512. In one embodiment, cover 1508 is removably attached to housing 1512 such that although cover 1508 is securely engaged to housing 1512 when a coupling is desired. However, in some embodiments, the cover 1508 is removably attached such that cover 1508 can be subsequently disengaged.

Figure 15B:
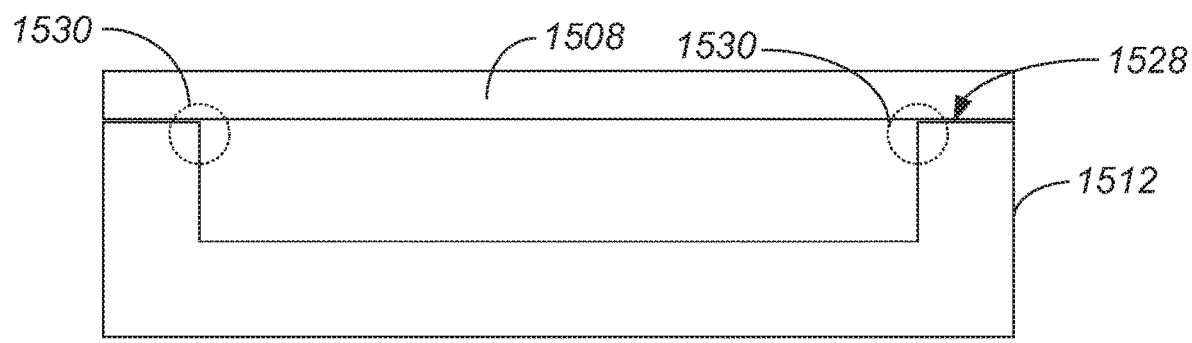
FIG. 15B is a diagrammatic cross-sectional side-view representation of a cover assembled to housing shown in FIG. 15A.

FIG. 15B is a diagrammatic cross-sectional side-view representation of a cover 1508 assembled to housing 1512. As shown, the size of cover 1508 and the size of housing 1512 as compared to FIG. 15A, are exaggerated for purposes of illustration. Cover 1508 and housing 1512 are coupled at an interface 1530 such that a gap 1528 between cover 1508 and housing 1512 may be controlled. In one embodiment, gap 1528 is essentially minimal, and surfaces of cover 1508 and housing 1512 may come into contact at and near interface 1530. Interface 1530 may include mechanical coupling arrangements, as will be discussed below, that allow cover 1508 to be mounted to housing 1512. As shown, interface 1530 is typically located in or near an inner volume defined by housing 1512 and cover 1508.

Figure 16:
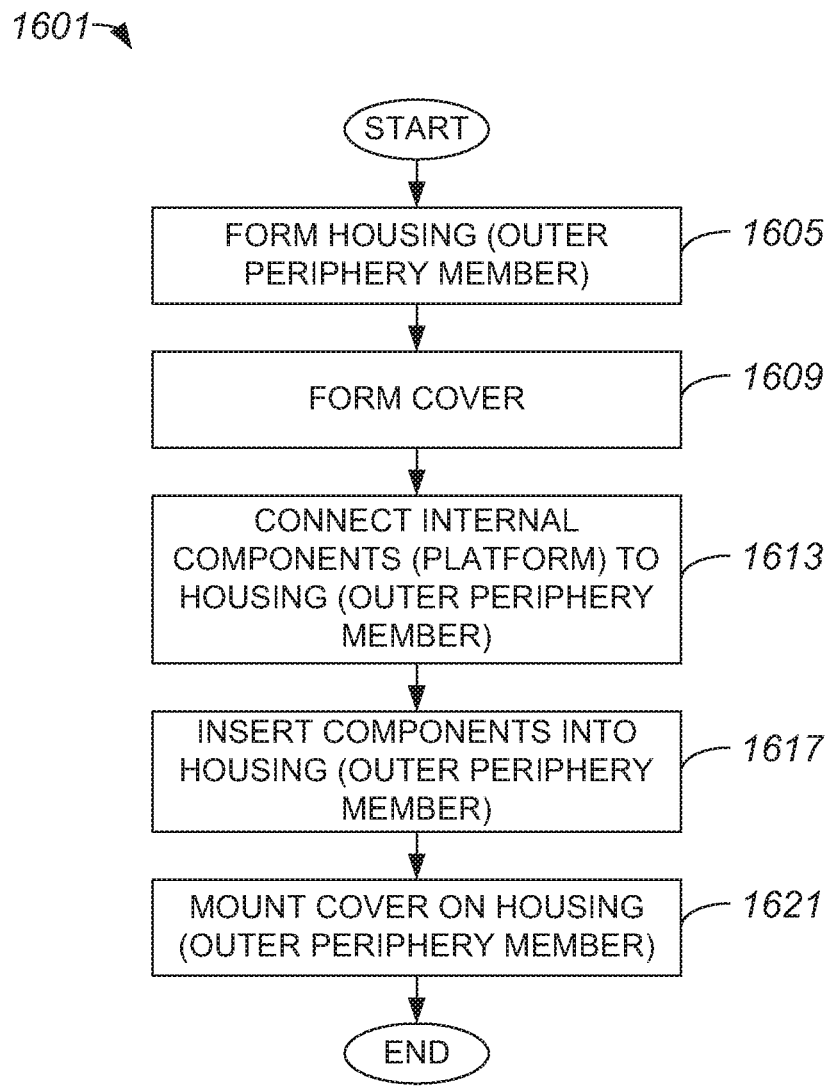
FIG. 16 is a flow diagram for assembling of an electronic device in accordance with one embodiment.

With reference to FIG. 16, one method of assembling an electronic device will be described in accordance with one embodiment. A method 1601 of assembling an electronic device begins at step 1605 in which a housing, e.g., an outer periphery member, is formed. In general, one or more components may form the housing. For example, two or more components may be joined or otherwise combined to form the housing. Forming the housing may also include attaching or otherwise creating attachment features on the housing that are configured to facilitate mounting a cover on the housing.

In step 1609, a cover is formed. Forming a cover may include, but is not limited to including, obtaining a frame, and attaching a glass member to the frame. It should be appreciated that forming a cover may also include effectively attaching or otherwise creating attachment features, as for example using an injection molding process, to the cover that are configured to facilitate mounting the cover to the housing. When attachment features are attached to the cover using an insert molding process, cover can be formed at least partially from a plastic material.

Once the housing and the cover are formed, internal structural components, e.g., an internal platform that can include electronic components, can be substantially connected to the housing in step 1613. For example, an internal member may be inserted within the housing and connected to several portions of the housing to define a structural component.

After the internal structural components are substantially connected to the housing, components may be inserted in step 1617 into the housing. For example, components, such as electrical components may be inserted from both sides of the housing. The cover may then be mounted on the housing in step 1621. Mounting the cover on the housing may include, but is not limited to including, engaging attachment features of the cover and the housing. The method of assembling an electronic device can be completed once the cover is mounted on the housing.

Figure 17:
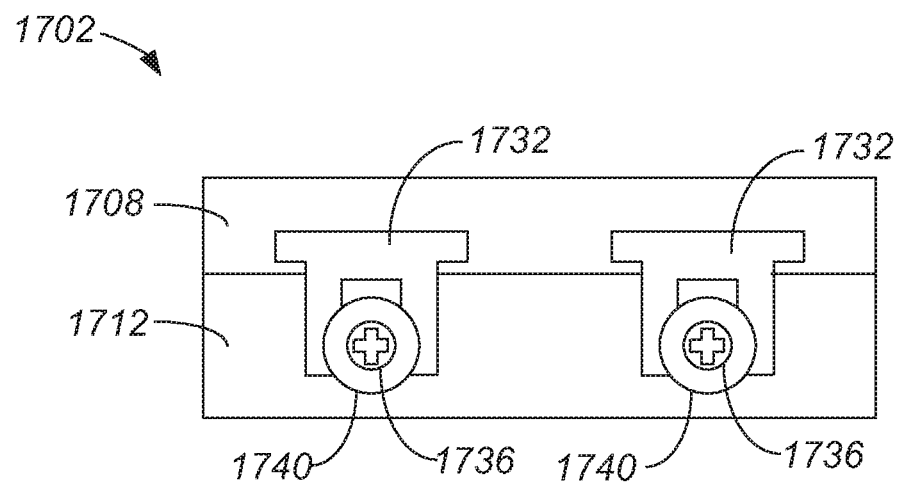
FIG. 17 is an assembly that includes side screws arranged to couple a cover to a housing will be described in accordance with one embodiment.

In one embodiment, a cover may be mounted on a housing through the use of screws. Referring next to FIG. 17, an assembly that includes side screws arranged to couple a cover to a housing will be described in accordance with one embodiment. FIG. 17 is a diagrammatic side-view representation of an interior surface of an assembly 1702. Assembly 1702 includes a portion of a cover 1708 and a portion of a housing 1712. Tabs 1732 are inserted in or otherwise attached to cover 1708. In one embodiment, tabs 1732 are metal tabs that are insert molded into cover 1708 and effectively protrude from cover 1708. Metal tabs may be formed from sheet metal of any suitable thickness, as for example a thickness of approximately 0.5 mm. Typically, tabs 1732 include slots through which screws 1736 may be inserted. In other words, tabs 1732 are generally slotted tabs. Housing 1712 includes screw receptacles (not shown), e.g., threaded screw holes, which are arranged to accommodate screws 1736.

When screws 1736 are used to secure tabs 1732 and, thus, cover 1708 to housing 1712, washers 1740 may be positioned between heads of screws 1736 and tabs 1732. Tabs 1732 are secured to housing 1712 when screws 1736 are screwed into screw receptacles (not shown) created in housing 1712. Tabs 1732, as shown, are secured to a surface of housing 1712 that is different from a surface of housing 1712 that essentially comes into contact with cover 1708.

Figure 18:
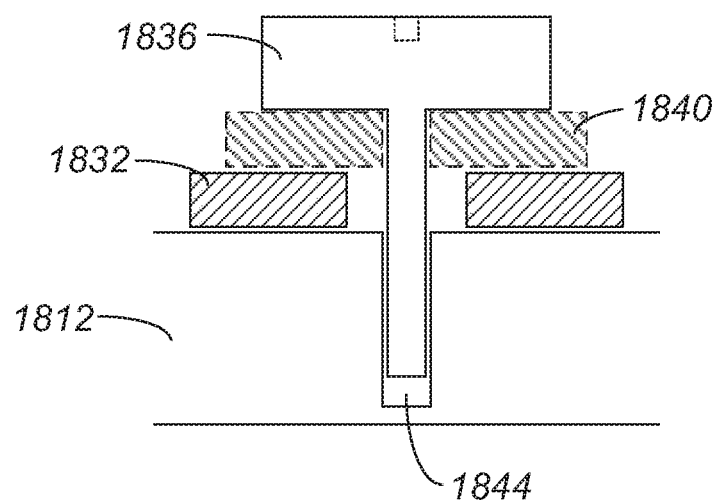
FIG. 18 is a diagrammatic cross-sectional representation of a coupling that utilizes a side screw and a slotted tab in accordance with one embodiment.

FIG. 18 is a diagrammatic cross-sectional representation of a coupling that utilizes a side screw and a slotted tab in accordance with one embodiment. A housing 1812 has an opening 1844 defined therein. In the described embodiment, opening 1844 is a threaded screw hole that may be formed into a side of housing 1812. A screw 1836 which is used to secure a slotted tab 1832, i.e., a slotted tab 1832 that is attached to or otherwise coupled to a cover (not shown), to housing 1812 passes through a washer 1840 and a slot in slotted tab 1832, and is screwed into housing 1812. Washer 1840 is generally used to promote thread engagement, i.e., washer 1840 enables a longer threaded length of screw 1836, and provides tolerances. It should be appreciated that washer 1840 may be optional.

Figure 19:
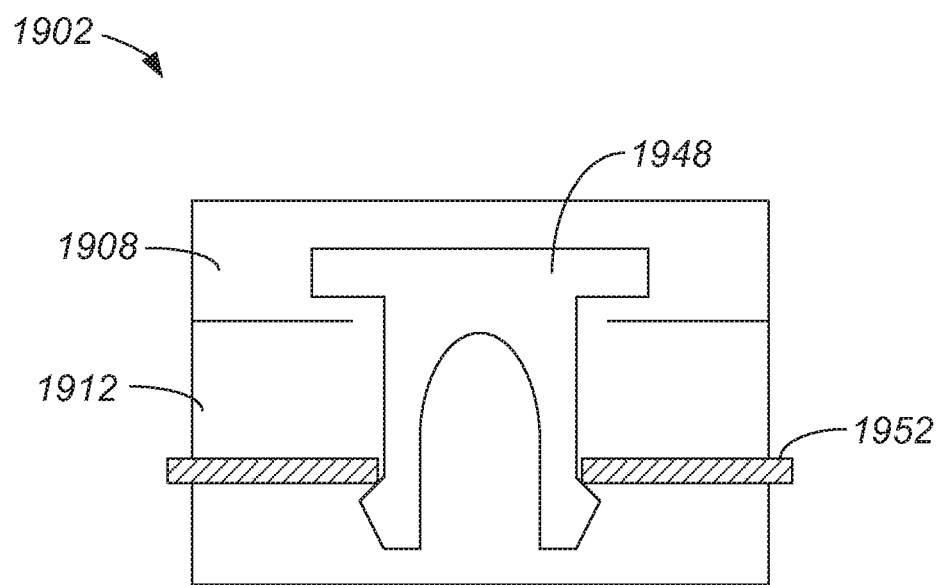
FIG. 19 is a diagrammatic cross-sectional representation of an assembly that includes a lobster snap and a midplate that cooperate to couple a cover frame to a housing in accordance with one embodiment.

In lieu of using screws to robustly mount a cover to a housing, other types of couplings may be used to robustly mount a cover to a housing. Another coupling that may be used to mount a cover to a housing includes a lobster snap and an internal structure (e.g., midplate). FIG. 19 is a diagrammatic cross-sectional representation of an assembly that includes a lobster snap and a midplate that cooperate to couple a cover frame to a housing in accordance with one embodiment. An assembly 1902 includes a portion of a cover 1908 and a portion of a housing 1912. A lobster snap 1948 is mounted in or otherwise attached to cover 1908. Lobster snap 1948, which may be formed from a metal that is insert molded into cover 1908, is arranged to be engaged by a midplate 1952 coupled to housing 1912. In one embodiment, lobster snap 1948 is formed from a compliant metal that is arranged to deflect from a "rest" position when being pushed through an opening defined in midplate 1952, and to substantially return to the rest position once inserted through the opening. The thickness of the metal used to form lobster snap 1948 may vary widely. In one embodiment, lobster snap 1948 may be formed from a sheet metal with a thickness of approximately 0.3 mm.

Figure 20:
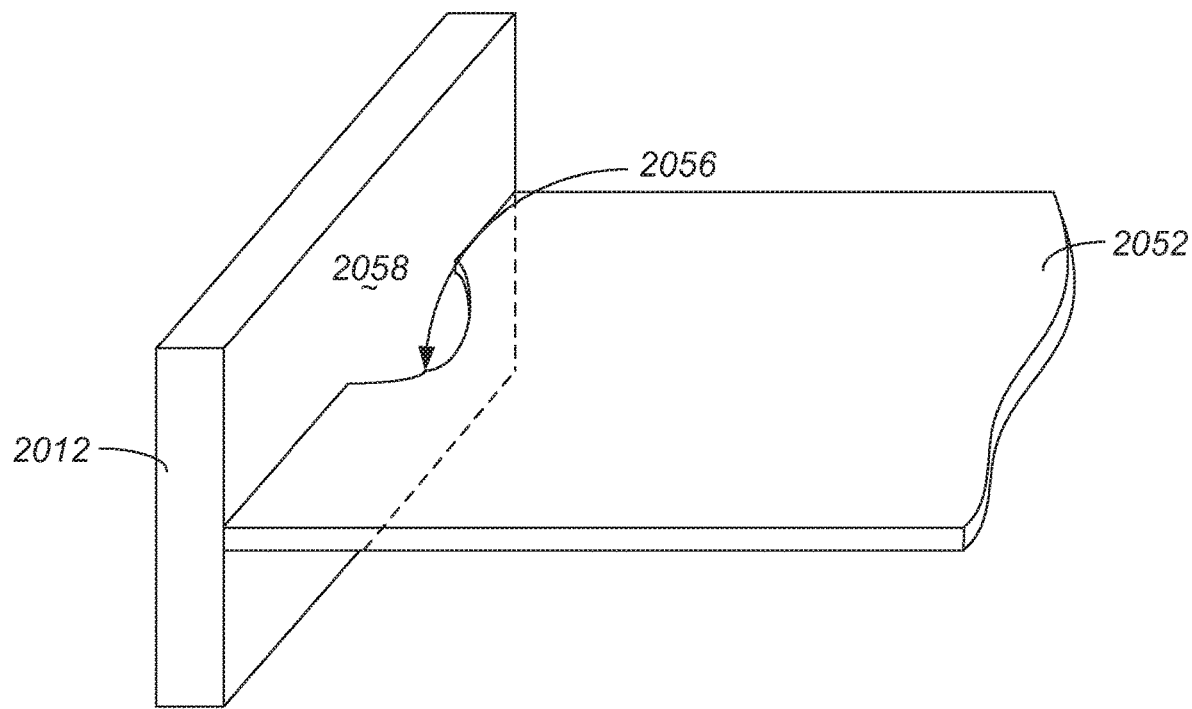
FIG. 20 is a diagrammatic representation of a housing to which a midplate is coupled in accordance with one embodiment.

Midplate 1952, which may be formed from metal, may be coupled to housing 1912 using any suitable method. By way of example, midplate 1952 may be welded into an interior surface of housing 1912. Referring next to FIG. 20, a housing to which a midplate is coupled, e.g., by welding, can be described in accordance with one embodiment. A housing 2012, which may be formed from metal, has an exterior surface (not shown) and an interior surface 2058. A midplate 2052, which may be a piece of sheet metal with at least one cut-out 2056 defined at an edge, is welded to interior surface 2058. When midplate 2052 is welded to interior surface 2058, cut-out 2056 cooperates with interior surface 2058 to define an opening through which a lobster snap, e.g., lobster snap 1948 of FIG. 19, may be inserted.

Figure 21:
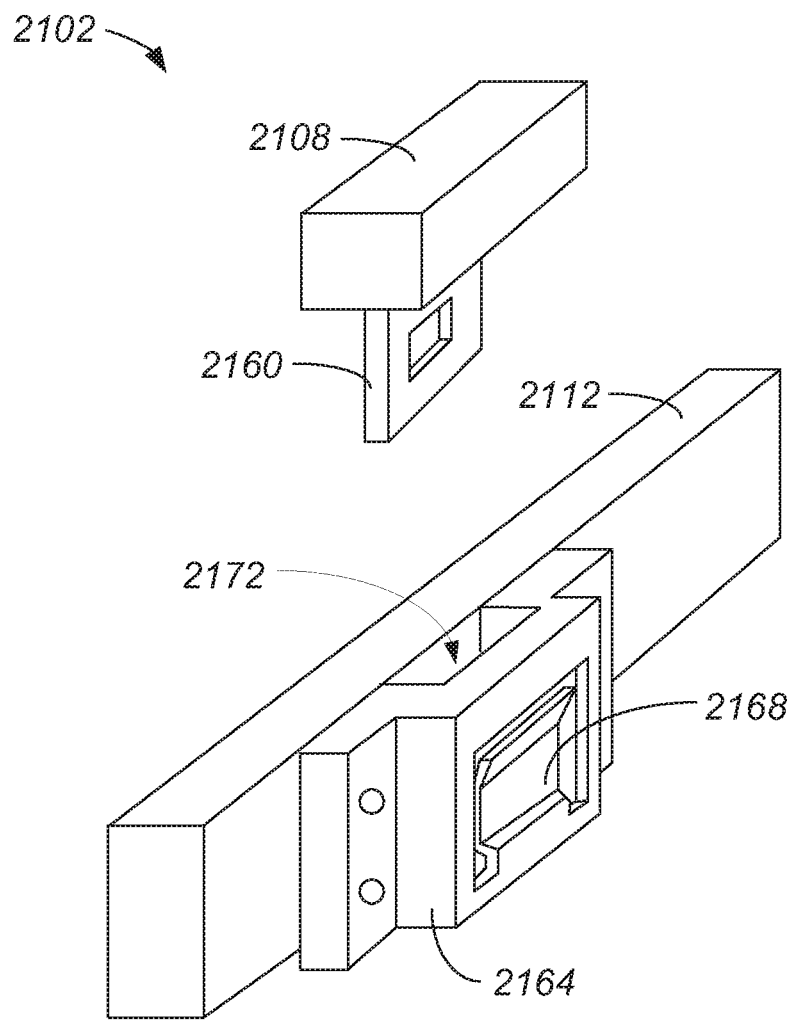
FIG. 21 is a diagrammatic representation of a cover piece having an insert molded tab and a housing having a bracket configured to accommodate the tab in accordance with one embodiment.

Another suitable coupling that allows a cover to be mounted on a housing is a snap arrangement that includes a bracket configured to accommodate a tab. Such a bracket may be mounted on a housing, and may include a complaint snap which is arranged to engage a tab coupled to a cover. FIG. 21 is a diagrammatic representation of a cover piece having an insert molded tab and a housing having a bracket configured to accommodate the tab in accordance with one embodiment. An assembly 2102, which is shown in a disassembled form for ease of illustration, includes a portion of a cover 2108 and a portion of a housing 2112. Cover 2108 includes a tab or a hook 2060 in which an opening is defined. Tab 2160, which may be formed from a sheet metal of any suitable thickness, e.g., a thickness of approximately 0.5 mm, may be insert molded into cover 2108. Housing 2112 has a bracket 2164 coupled thereto. Bracket 2164, which may be formed from a metal, may be welded to a surface, e.g., an interior surface, of housing 2112.

A compliant snap 2168 is formed in bracket 2164, and is configured to engage with tab 2160 when tab 2160 is inserted through an opening 2172, e.g., a "doghouse" snap opening," defined by bracket 2164 and an interior surface of housing 2112. A compressive force is generally applied by compliant snap 2168 against tab 2160 to secure tab 2160 within opening 2172 and, thus, to hold cover 2108 substantially against housing 2112.

Figure 22:
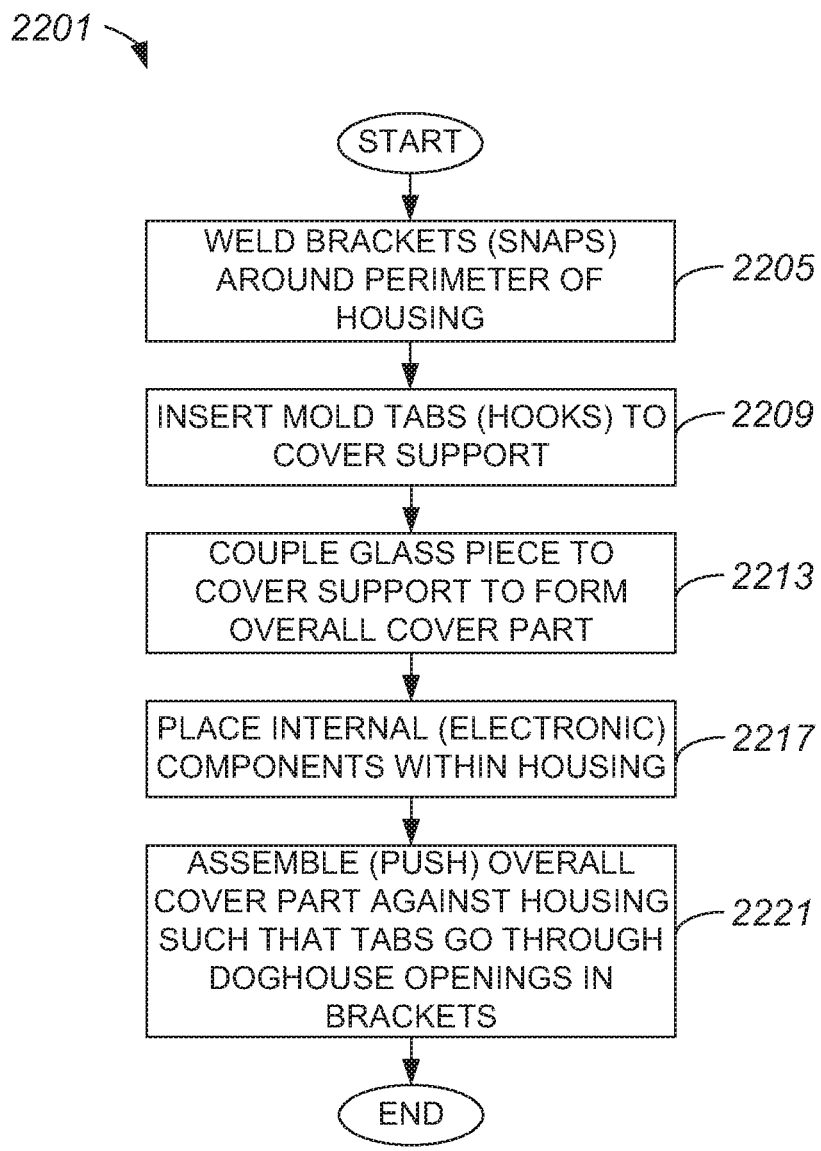
FIG. 22 is a process flow diagram which illustrates a method of creating a device that includes a cover piece having an insert molded tab and a housing having a bracket configured to accommodate the tab in accordance with one embodiment.

FIG. 22 is a process flow diagram which illustrates a method of creating a device that includes a cover piece having an insert molded tab and a housing having a bracket configured to accommodate the tab, as for example described above with respect to FIG. 21, in accordance with one embodiment. A method 2201 of creating a device that includes a cover piece which is mounted to a housing a coupling that includes a tab and a bracket begins at step 2205 in which brackets, i.e., brackets which include a snap component, can be welded around the perimeter of the sides of a housing. Brackets may, for example, be same or similar to bracket 2164 of FIG. 21. Any number of brackets may generally be welded around the perimeter of the sides of a housing. By way of example, ten brackets may be welded around the perimeter of the housing. It should be appreciated that brackets may also be attached to the housing methods other than welding.

Once brackets are welded or, more generally, attached to the perimeter of the sides of the housing, tabs or hooks can be insert molded to cover support in step 2209. Then, in step 2213, a glass piece is coupled to the cover support to form an overall cover part. In one embodiment, the cover support may be a frame within which the glass piece may be secured.

Any suitable method may typically be used to couple the glass piece to the cover piece.

After the overall cover part is formed, process flow moves to step 2217 in which internal components are placed within an interior volume defined within the housing. The internal components generally include, but are not limited to including, electronic components. The overall cover part is assembled against the housing in step 2221 such that the tabs in the cover piece are substantially inserted through doghouse openings in the brackets welded to the housing. When tabs are inserted through doghouse openings, complaint snaps of the brackets may engage the tabs to hold the overall cover part against the housing. Upon assembling the overall cover part against the housing such that tabs go through doghouse openings in brackets, the method of creating a device is completed.

Although only a few embodiments of the invention have been described, it should be understood that the invention may be embodied in many other specific forms without departing from the spirit or the scope of the present invention. By way of example, a cover has generally been described as being removably coupled to a housing. Screws may be unscrewed to remove a cover from a housing, snaps may be disengaged from a midplate, and tabs may be disengaged from a snap. The ability to substantially disengage or decouple a cover from a housing may enable maintenance and repairs to be performed on components held by the housing. In some embodiments, however, cover may be substantially irremovably coupled to a housing.

While a cover has generally been described as including a cover support (e.g., frame) to which a glass member is attached, it should be appreciated that the cover itself may be a glass member. In an embodiment in which the cover itself is a glass member, attachment features such as tabs and snaps may be glued directly to the glass member or indirectly to the glass member. When attachment features are glued indirectly to the glass member, the attachment features may be insert molded into pieces of plastic, and the pieces of plastic may be glued or otherwise attached to the glass member.

As shown for example in FIGS. 17 and 19, the side of a housing which is associated with the engagement of a tab of a cover part is not the same as the side of the housing which interfaces with, e.g., comes substantially into contact with, the cover part. That is, the side of a housing that is used to engage a cover is different from the side or surface of the housing that is substantially sealed against the cover. It should be appreciated that in lieu of the housing substantially being sealed against the cover when the housing engages the cover, there may instead be a gap between the housing and the cover. In one embodiment, a material such as a compliant material may be placed in the gap between the housing and the cover.

Any number of coupling arrangements that allow a cover to be mounted to a housing may generally be included in an electronic device. Coupling arrangements are generally arranged along an interior periphery of an electronic device, and the number of coupling arrangements in an electronic device may be dependent upon factors including, but not limited to including, the size of the electronic device and the space available in the interior of the electronic device. In one embodiment, between approximately ten and approximately twenty coupling arrangements may be included in an electronic device. It should be appreciated, however, that fewer than ten and more than twenty coupling arrangements may generally be included in an electronic device.

Optical Lens Formation

According to still another aspect, an optical lens can be formed from a formed optical adhesive. The optical lens can, for example, be used as a lens for a camera flash of a portable electronic device. A mold can be used to form a lens from an optical adhesive that can be cured while being molded. For example, the optical adhesive can be a liquid adhesive that can be cured by ultraviolet (UV) radiation. In one embodiment, a mold (e.g., steel mold) having a lens configuration can be applied to the uncured optical adhesive, and then UV radiation applied to cure the optical adhesive. Once cured, the mold can be removed and the optical lens has been formed. In one particular embodiment, the optical lens can be formed on an inner surface of a glass housing member for a portable electronic device, and the curing of the optical adhesive to form the optical lens can be performed by UV radiation that is directed to the optical adhesive through the glass housing member. In another particular embodiment, the optical lens can be formed on an optical substrate (e.g., clear plastic carrier), and then the optical substrate can later be mounted in a portable electronic device, such as on an inner surface of a glass housing member for the portable electronic device.

In one embodiment, the portable electronic device having the optical lens formed from the optical adhesive can be configured to include a housing surface that has at least an opening or transparent portion. The portable electronic device can also include a camera and a camera flash light element for producing light. The optical lens receives at least a portion of light produced by the camera flash light element, and directs the received light through the opening or transparent portion of the housing surface. The optical lens can be formed from an optical adhesive that is molded and cured into a predetermined lens configuration.

Cover Assembly Structure and Assembly

According to still another aspect, a cover assembly, such as a back cover assembly, can be configured to support and protect an outer glass member. The cover assembly can form part of a housing for an electronic device. The cover assembly can also include a distinct glass lens, attachment members, and structural support.

Figure 23A:
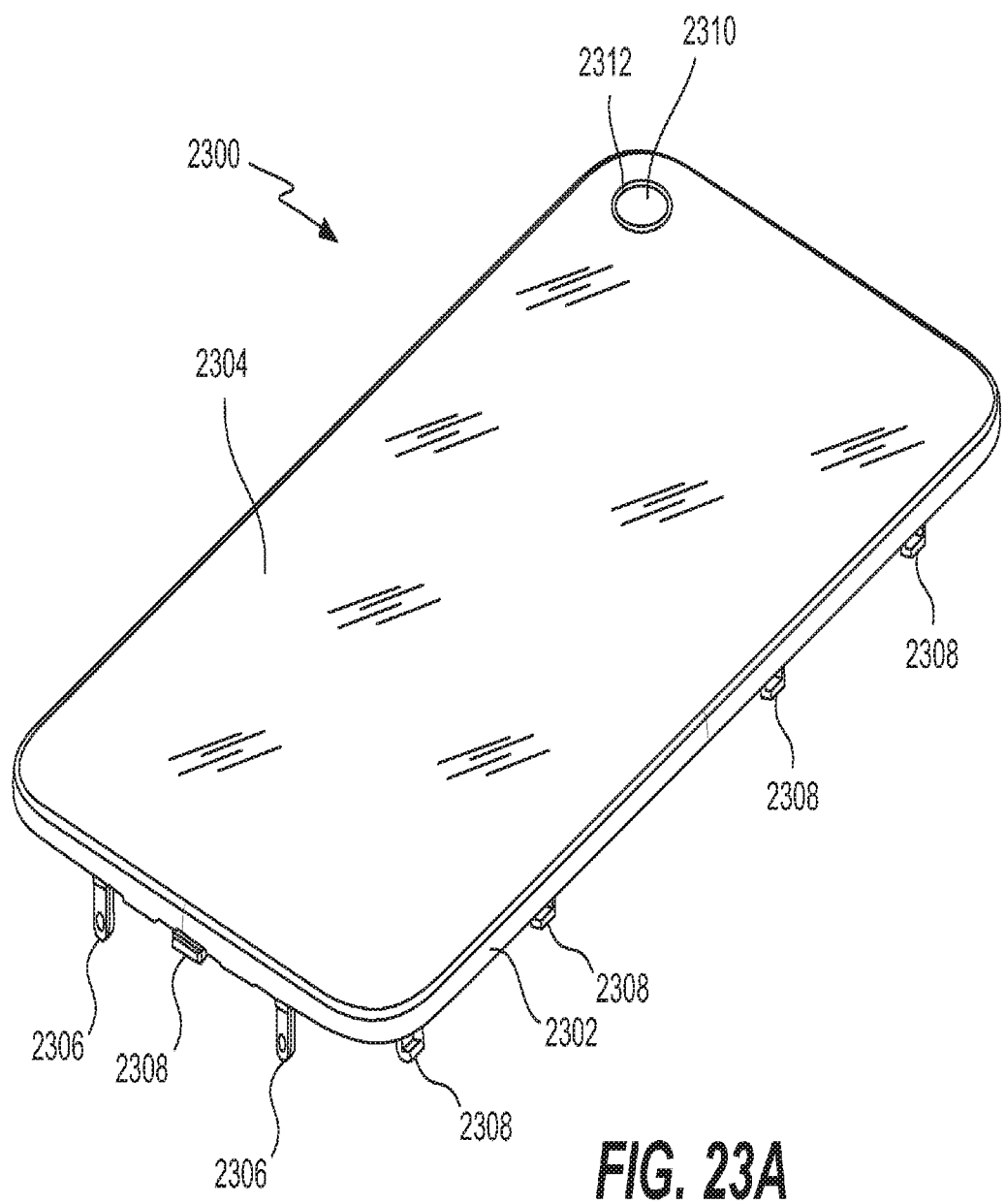
FIGS. 23A-23C illustrate perspective diagrams of a back cover assembly 2300 according to one embodiment.
Figure 23B:
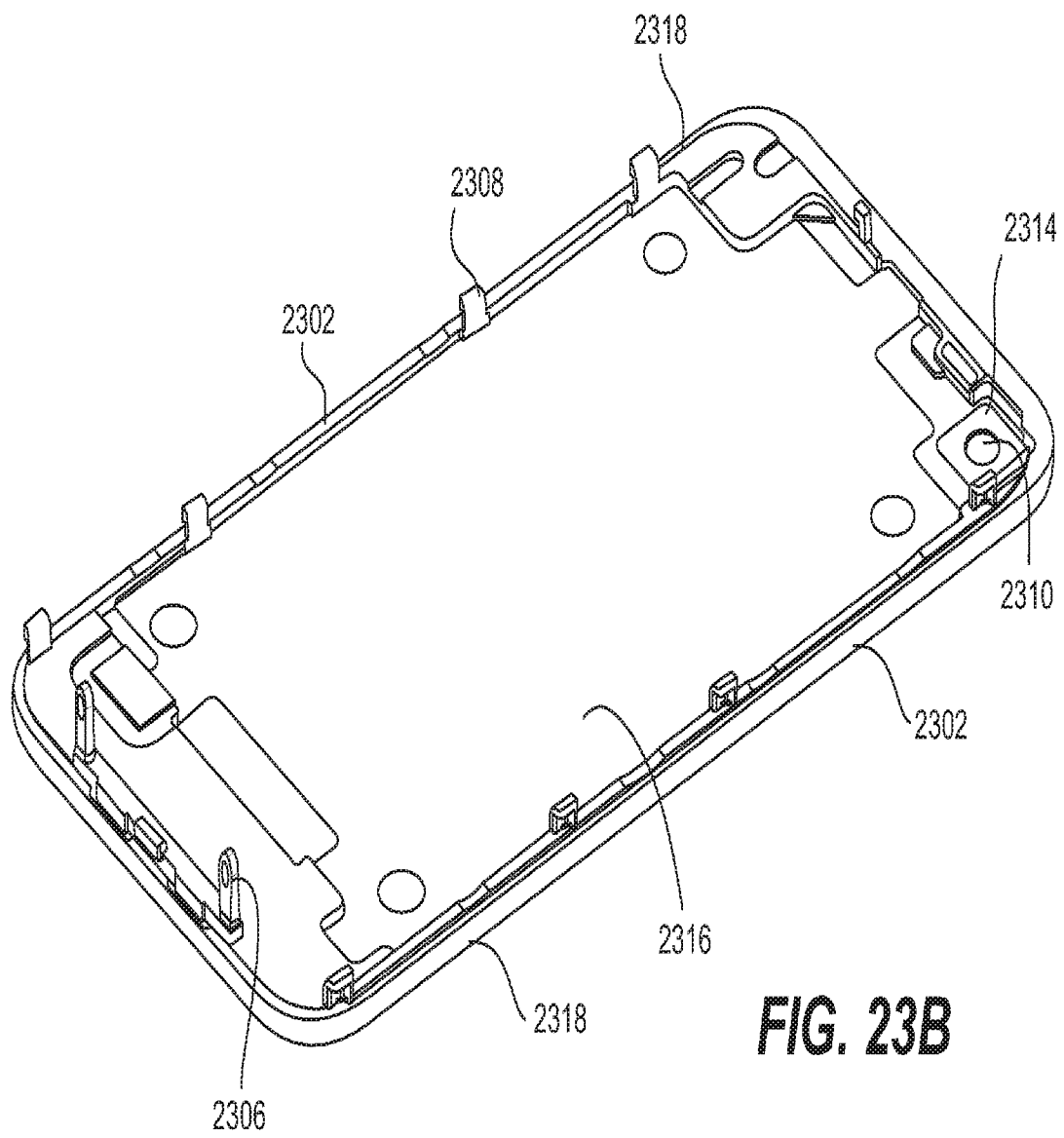
Figure 23C:
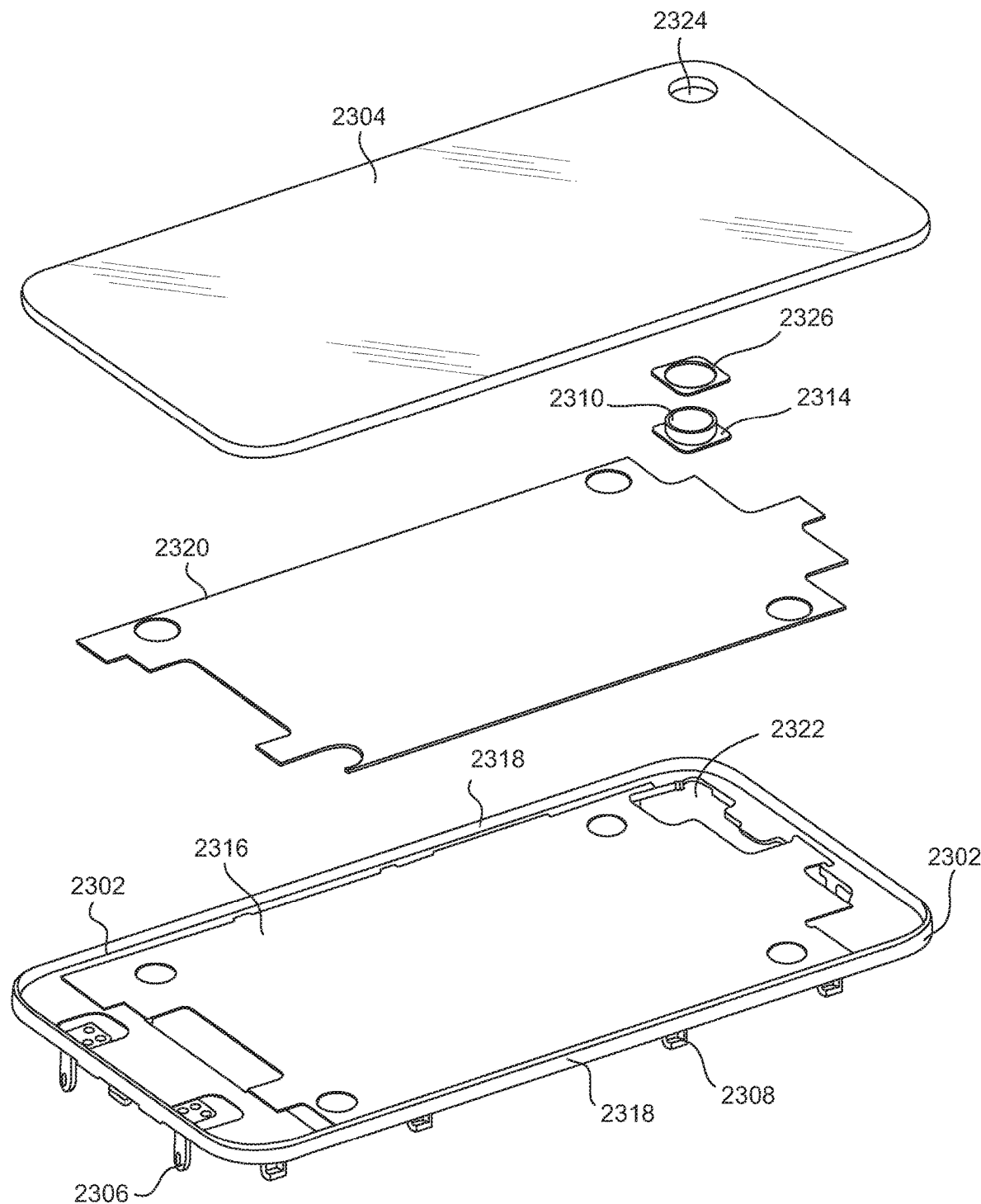

FIGS. 23A-23C illustrate perspective diagrams of a back cover assembly 2300 according to one embodiment. The back cover assembly 2300 can, for example, represent one implementation of the back cover assembly 260 illustrated in FIG. 2B. The back cover assembly 2300 can also represent the assembly of the second outer housing member 1016 and the second interface member 1018 (with the protective side members 1020) illustrated in FIG. 10, and/or the assembly of the second outer housing member 1216 and the second interface member 1218 (with the protective side members 1220) illustrated in FIG. 12.

FIG. 23A illustrates a front perspective diagram for the back cover assembly 2300 according to one embodiment. The back cover assembly 2300 can include an interface member 2302 and a glass member 2304 (e.g., glass plate). The interface member 2302 provides a support structure that can be secured to a base housing. In one embodiment, the interface member 2302 can be removably secured to the base housing.

The back cover assembly 2300 can be secured to the base housing in any of a variety of ways. In the embodiment of the interface member 2302 illustrated in FIG. 23A, the interface member 2302 includes one or more tabs 2306 and one or more hooks 2308. The one or more tabs 2306 and the one or more hooks 2308 are used to secure the back cover assembly 2300 to the base housing, such as the outer periphery member 220 discussed above. The one or more hooks 2308 can include threaded openings (e.g., holes) that can receive attachment screws, which serve to firmly secure the back cover assembly 2300 to the base housing (e.g., the outer periphery member 220). The attachment screws can prevent removal of the back cover assembly 2300 from the base housing. However, by removal of the attachment screws, the back cover assembly 2300 can then be removed.

The glass member 2304 is a thin glass sheet that is configured to fit within a recess provided by the interface member 2302. In one embodiment, while within the recess, the sides (e.g., edges) of the glass member 2304 can be protected by protective side structural members. A glass piece 2310 and an optical barrier 2312 can be coupled to the glass member 2304. The glass piece 2310 can be provided for an image acquisition device (e.g., camera) that is provided within the base housing for the electronic device. The glass piece 2310 is separate from the glass member 2304. The glass piece 2310 can also provide different optical properties than those of the glass member 2304. For example, the glass piece 2310 may (itself or via a coating) provide optical filtering (e.g., infrared filtering) or magnification. In other words, the glass piece 2310 can act as a lens, a filter or both.

The size, dimensions and materials for the components of the housing for the electronic device can vary with different embodiments. In the case of portable electronic devices, the thickness of the back cover assembly 2300 (excluding the one or more tabs 2306 and the one or more hooks 2308) can be about 5 millimeters or less. For thin, portable electronic devices (such as handheld electronic devices), the thickness of the back cover assembly 2300 (excluding the one or more tabs 2306 and the one or more hooks 2308) can be about 2 millimeters or less millimeters. Moreover, the thickness of the glass member 2304 can be about 1 millimeter or less. For example, the thickness of the glass of the glass member 2304 can be about 0.3 to 0.6 micrometers. The glass member 2304 is glass (e.g., alumina silicate or soda lime glass). However, in alternative embodiments, the glass member 2304 could be replaced by a member that is made (in whole or in part) of metal, ceramic and/or plastic material.

FIG. 23B illustrates a rear perspective diagram for the back cover assembly 2300 according to one embodiment. The interface member 2302 primarily extends around a periphery of the back cover assembly 2300. The interface member 2302 can be made from a polymer. The interface member 2302 illustrates a lens holder 2314 to secure the glass piece 2310 to the interface member 2302. The interface member 2302 can also include a reinforcement plate 2316 that serves to strengthen the interface member 2302. The reinforcement plate 2316 can be formed of metal, such as stainless steel. The reinforcement plate 2316 is a separate piece from an outer periphery support portion 2318. The reinforcement plate 2316 can be secured to the outer periphery support portion 2318. For example, the reinforcement plate 2316 can be inserted into the outer periphery support portion 2318 had held in place with slots and/or tabs. As another example, the outer periphery portion 2318 can be insert molded around portions of the reinforcement plate 2316 to secure the reinforcement plate 2316 to the outer periphery boundary 2318. Additionally, in one embodiment, the one or more tabs 2306 and/or the one or more hooks 2308 can be strengthened by features of the reinforcement plate 2316. For example, the one or more hooks 2308 can be structurally reinforced by features of the reinforcement plate 2316 that can extend upward from the reinforcement plate 2316 into or adjacent the one or more hooks.

FIG. 23C illustrates an assembly diagram for the back cover assembly 2300 according to one embodiment. The assembly of the back cover assembly 2300 can provide the interface member 2302 having the outer periphery support portion 2318 secured or integral thereto. A layer of adhesive 2320 can be provided between the reinforcement plate 2316 and the interface member 2302. The layer of adhesive 2320 can be applied as a film, spray, tape or coating. Besides the layer of adhesive 2320, liquid adhesive can also be deposited in certain areas where the layer of adhesive 2320 is not present. The glass member 2304 can be pressed against the layer of adhesive 2320 (and liquid adhesive) so that the glass member 2304 can be attached to the interface member 2302. Specifically, the glass member 2304 once aligned and attached to the interface member 2302 is not only secured thereto but also has its sides (edges) protected by the outer periphery support portion 2318. By adhering the glass member 2304 to a substantial amount of its surface area, the glass member 2404 is reliably secured, such that in the event of breakage of the glass member 2304, pieces of the glass member 2304 will remain secured to the adhesive and this the back cover assembly 2300.

Additionally, a back cover assembly can also include one or more features to facilitate image acquisition. In one embodiment, the back cover assembly 2300 can also include an opening 2322 in the interface member 2302 for image acquisition components. Within the base housing there can be provided an image acquisition device (generally, denoted as a camera), and the opening 2322 in the interface member 2302 can be aligned with the position of the image acquisition device. Additionally, the glass member 2304 can include an opening 2324 for receiving the glass piece 2310 as well as the lens holder 2314 that contains glass piece 2310. An adhesive ring 2326 can be imposed between the lens holder 2314 and the rear side of the glass member 2304 such that the adhesive ring 2326 is disposed around the opening 2324 so as to secure the lens holder 2314 against the rear side of the glass member 2304.

Figure 24:
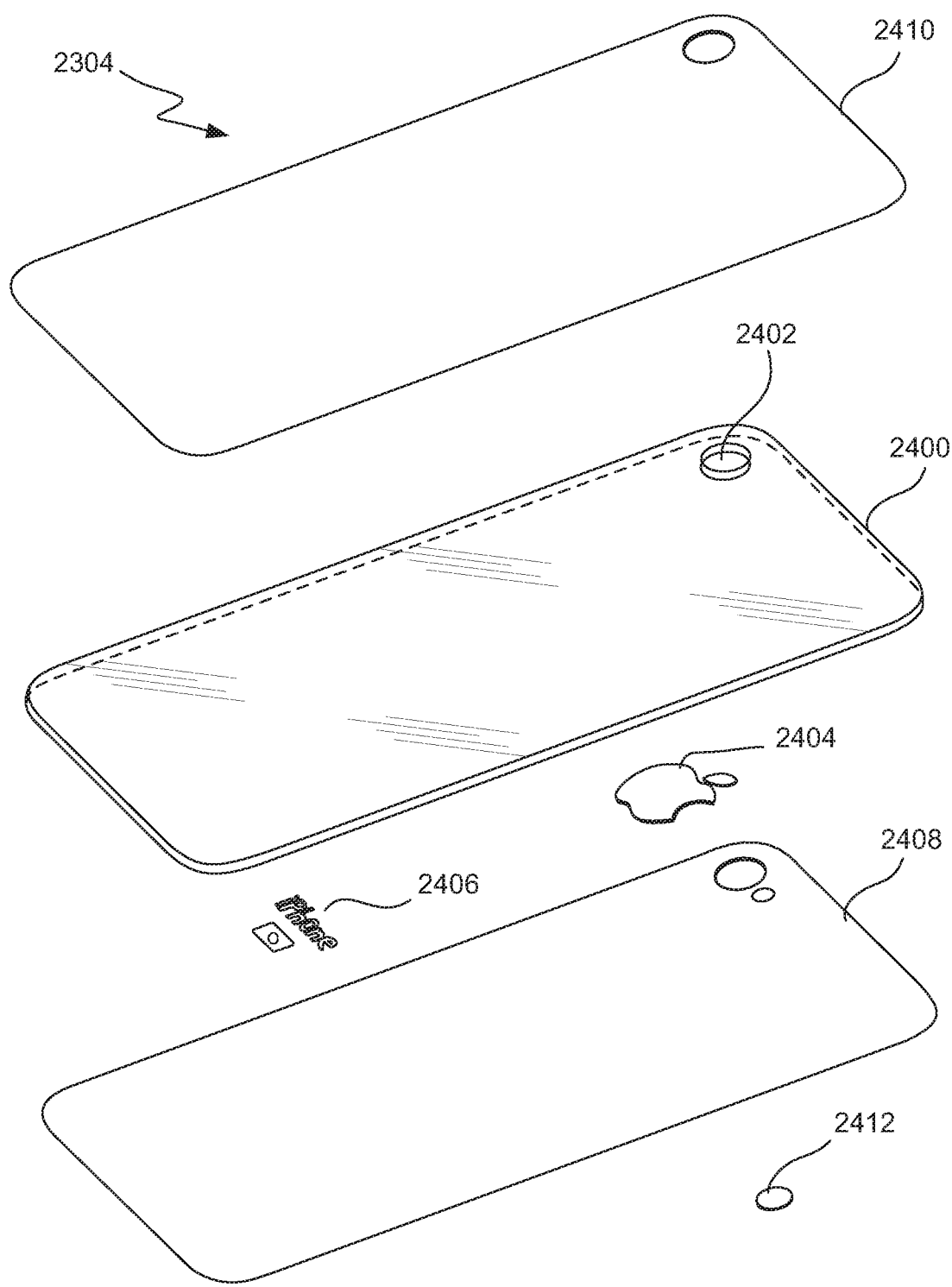
FIG. 24 illustrates an assembly diagram for the glass member according to one embodiment.

FIG. 24 illustrates an assembly diagram for the glass member 2304 according to one embodiment. Although the glass member 2304 is primarily a glass component form from a piece of glass 2400, other components or materials can be adhered to the piece of glass 2400 to make it better suited for its intended use as a back cover portion of housing for an electronic device. Specifically, physical vapor deposition (PVD) of metal (e.g., aluminum) can provide marking on the piece of glass 2400. The marking can include graphic (e.g., logos) 2404 or text 2406. In this embodiment, the marking can be provided on an inside surface of the piece of glass 2400. The glass member 2304 can also include a masking layer 2408. The masking layer 2408 can also be provided on the inside surface of the piece of glass 2400. The masking layer 2408 can color the otherwise translucent glass of the piece of glass 2400. The masking layer 2408 can render the glass member opaque so as to obscure or hide the appearance of components behind the piece of glass 2400. Because the marking and the masking layer 2408 are on the inside surface of the piece of glass 2400, they are protected by the piece of glass 2400 and this unlikely to be damaged during use. Additionally, in one embodiment, a coating layer 2410 can be applied to an outer surface of the piece of glass 2400. The coating layer 2410 can serve to reduce visibility of finger marks of a user from appearing on the outer surface of the piece of glass 2400. The coating layer 2410 can provide an anti-fingerprinting coating (e.g., Anti-fingerprint Fluorosilicate Coating) that can reduce surface contamination (smudging, staining) on the piece of glass 2400.

Miscellaneous

In general, the steps associated with the methods of the present invention may vary widely. Steps may be added, removed, altered, combined, and reordered without departing from the spirit or the scope of the present invention.

The various aspects, features, embodiments or implementations of the invention described above may be used alone or in various combinations. For example, side screws and lobster snaps may cooperate to attach a cover to a housing.

While this specification contains many specifics, these should not be construed as limitations on the scope of the disclosure or of what may be claimed, but rather as descriptions of features specific to particular embodiment of the disclosure. Certain features that are described in the context of separate embodiments may also be implemented in combination. Conversely, various features that are described in the context of a single embodiment may also be implemented in multiple embodiments separately or in any suitable subcombination. Moreover, although features may be described above as acting in certain combinations, one or more features from a claimed combination can in some cases be excised from the combination, and the claimed combination may be directed to a subcombination or variation of a subcombination.

While embodiments and applications have been shown and described, it would be apparent to those skilled in the art having the benefit of this disclosure that many more modifications than mentioned above are possible without departing from the inventive concepts herein.

What is claimed is:

1. A portable electronic device comprising:
a touch screen display;
a battery; and
a housing enclosing the touch screen display and the battery, the housing comprising:
a front cover assembly comprising:
a front glass member positioned over the touch screen display, the front glass member and the touch screen display defining a touch-sensitive surface along a substantial entirety of a front surface of the portable electronic device; and
a front protective side structural member formed from a first polymer material and attached to the front glass member by a first adhesive;
a back cover assembly comprising:
a back glass member; and
a back protective side structural member formed from a second polymer material and attached to the back glass member by a second adhesive; and
an outer periphery member positioned between the front cover assembly and the back cover assembly, the outer periphery member coupled to the front protective side structural member and the back protective side structural member.

2. The portable electronic device of claim 1, wherein:
the front protective side structural member defines a front protective side member that is positioned along a side of the front glass member; and
the back protective side structural member defines a back protective side member that is positioned along a side of the back glass member.

3. The portable electronic device of claim 2, wherein:
the outer periphery member defines a first portion of a side surface of the housing;
the front protective side member defines a second portion of the side surface of the housing; and
the back protective side member defines a third portion of the side surface of the housing.

4. The portable electronic device of claim 1, wherein the outer periphery member defines an internal structure that is offset from the front and back cover assemblies.

5. The portable electronic device of claim 4, wherein the internal structure is integrally formed with a side wall of the outer periphery member.

6. The portable electronic device of claim 1, wherein:
the portable electronic device further comprises electronic circuitry;
the outer periphery member is formed from a conductive metal segment; and
the conductive metal segment is operably coupled to the electronic circuitry and configured to operate as an antenna.

7. The portable electronic device of claim 1, wherein:
the back cover assembly further comprises an ink layer coupled to an inner surface of the back glass member; and
the back cover assembly is rendered opaque by the ink layer.

8. The portable electronic device of claim 1, wherein:
the back glass member defines a substantial entirety of a back surface of the portable electronic device.

9. An electronic device comprising:
electronic circuitry;
a display; and
a housing enclosing the electronic circuitry and the display, the housing comprising:
an outer periphery member defining a side exterior surface of the housing;
a front cover assembly including a front member formed from a first glass material and defining a display window over a substantial entirety of a front exterior surface of the housing and a front structural member formed from a first polymer material and coupling the front member to the outer periphery member; and
a back cover assembly including a back member formed from a second glass material and defining a back exterior surface of the housing and a back structural member formed from a second polymer material and coupling the back member to the outer periphery member.

10. The electronic device of claim 9, wherein:
the front structural member defines a front protective side bumper that extends at least partially along a side surface of the front member; and
the back structural member defines a back protective side bumper that extends at least partially along a side surface of the back member.

11. The electronic device of claim 9, wherein:
the housing further comprises an internal structure that is positioned between the front cover assembly and the back cover assembly; and
the electronic circuitry is coupled to the internal structure.

12. The electronic device of claim 11, wherein the internal structure is integrally formed with the outer periphery member.

13. The electronic device of claim 9, wherein:
the front structural member defines an opening for the display.

14. The electronic device of claim 9, wherein:
the front member is coupled to the front structural member by a first adhesive layer; and
the back member is coupled to the back structural member by a second adhesive layer.

15. The electronic device of claim 9, wherein:
the electronic device further comprises a camera positioned inward of the front member;
the electronic device further comprises an infrared sensor positioned inward of the front member; and
the front member defines one or more regions configured to pass signals to the camera and the infrared sensor.

16. A housing for an electronic device, the housing comprising:
a front cover assembly including a front member formed from a first glass material and defining a substantial entirety of a front exterior surface of the housing and a front structural member formed from a first polymer material, attached to the front member by a first adhesive, and defining an opening configured to receive a touch sensor extending along a substantial entirety of an interior surface of the front member;
a back cover assembly including a back member formed from a second glass material and defining a substantial entirety of a rear exterior surface of the housing and a back structural member formed from a second polymer material and attached to the back member by a second adhesive; and
an outer periphery member positioned between and coupled to the front cover assembly and the back cover assembly.

17. The housing of claim 16, wherein:
the outer periphery member defines a first portion of a side surface of the housing;
the front cover assembly defines a second portion of the side surface of the housing; and
the back cover assembly defines a third portion of the side surface of the housing.

18. The housing of claim 17, wherein:
the front structural member defines the second portion of the side surface; and
the back structural member defines the third portion of the side surface.

19. The housing of claim 16, wherein:
the front structural member is coupled to the outer periphery member by a third adhesive; and
the back structural member is coupled to the outer periphery member by a fourth adhesive.

20. The housing of claim 16, wherein:
the outer periphery member defines a conductive segment; and
the conductive segment is configured to operate as an antenna of the electronic device.

\* \* \* \* \*